US012796218B2

(12) United States Patent
Fukuda

(10) Patent No.: US 12,796,218 B2
(45) Date of Patent: Nov. 10, 2026

(54) DISPLAY DEVICE AND MANUFACTURING METHOD OF DISPLAY DEVICE

(71) Applicant: Magnolia White Corporation, Tokyo (JP)

(72) Inventor: Kaichi Fukuda, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 310 days.

(21) Appl. No.: 18/751,354

(22) Filed: Jun. 24, 2024

(65) Prior Publication Data

US 2025/0008769 A1 Jan. 2, 2025

(30) Foreign Application Priority Data

Jun. 29, 2023 (JP) ................................ 2023-106953

(51) Int. Cl.

| | |
|---|---|
| ***H10K 59/12*** | (2023.01) |
| ***H10K 59/122*** | (2023.01) |
| ***H10K 59/131*** | (2023.01) |
| ***H10K 59/80*** | (2023.01) |
| ***H10K 71/60*** | (2023.01) |
| *H10K 102/00* | (2023.01) |
| *H10K 102/10* | (2023.01) |
| *H10K 102/20* | (2023.01) |

(52) U.S. Cl.

CPC ....... *H10K 59/1201* (2023.02); *H10K 59/122* (2023.02); *H10K 59/1315* (2023.02); *H10K 59/80517* (2023.02); *H10K 59/80518* (2023.02); *H10K 71/60* (2023.02); *H10K 2102/103* (2023.02); *H10K 2102/20* (2023.02); *H10K 2102/351* (2023.02)

(58) Field of Classification Search

CPC ............. H10K 59/1201; H10K 59/122; H10K 59/1315; H10K 59/80517; H10K 59/80518; H10K 71/60; H10K 2102/103; H10K 2102/20; H10K 2102/351; H10K 59/878; H10K 59/805

See application file for complete search history.

(56) References Cited

U.S. PATENT DOCUMENTS

| | | | | |
|---|---|---|---|---|
| 10,825,876 | B2 * | 11/2020 | Kim ....................... | H10K 50/13 |
| 2004/0160170 | A1 | 8/2004 | Sato et al. | |
| 2009/0009069 | A1 | 1/2009 | Takata | |
| 2019/0363275 | A1 | 11/2019 | Ochi et al. | |
| 2022/0077251 | A1 * | 3/2022 | Choung ............... | H10K 59/173 |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Karen Kusumakar
(74) *Attorney, Agent, or Firm* — XSENSUS LLP

(57) ABSTRACT

According to one embodiment, a display device includes a base electrode including a first reflective layer, a lower electrode including a second reflective layer and provided on the base electrode, and a rib which covers an edge portion of the base electrode and has a pixel aperture overlapping the lower electrode. A width of the base electrode is greater than a width of the lower electrode.

20 Claims, 19 Drawing Sheets

DISPLAY DEVICE AND MANUFACTURING METHOD OF DISPLAY DEVICE

CROSS-REFERENCE TO RELATED APPLICATION

This application is based upon and claims the benefit of priority from Japanese Patent Application No. 2023-106953, filed Jun. 29, 2023, the entire contents of which are incorporated herein by reference.

FIELD

Embodiments described herein relate generally to a display device and a manufacturing method of a display device.

BACKGROUND

Recently, display devices to which various types of display elements such as an organic light emitting diode (OLED) are applied have been put into practical use. For example, a display element which is an OLED comprises a lower electrode, an organic layer which covers the lower electrode, and an upper electrode which covers the organic layer. The organic layer emits light based on voltage which is applied between the lower electrode and the upper electrode. The light emitted by the organic layer passes through the upper electrode and exits from a display surface. A good reflectance for reflecting the light emitted by the organic layer is required for the lower electrode.

In terms of the increase in the aperture ratio of each display element, the increase in the definition, the improvement of the reflectance, the improvement of the yield, etc., the structure of each lower electrode has room of examination.

DETAILED DESCRIPTION

Figure 1:
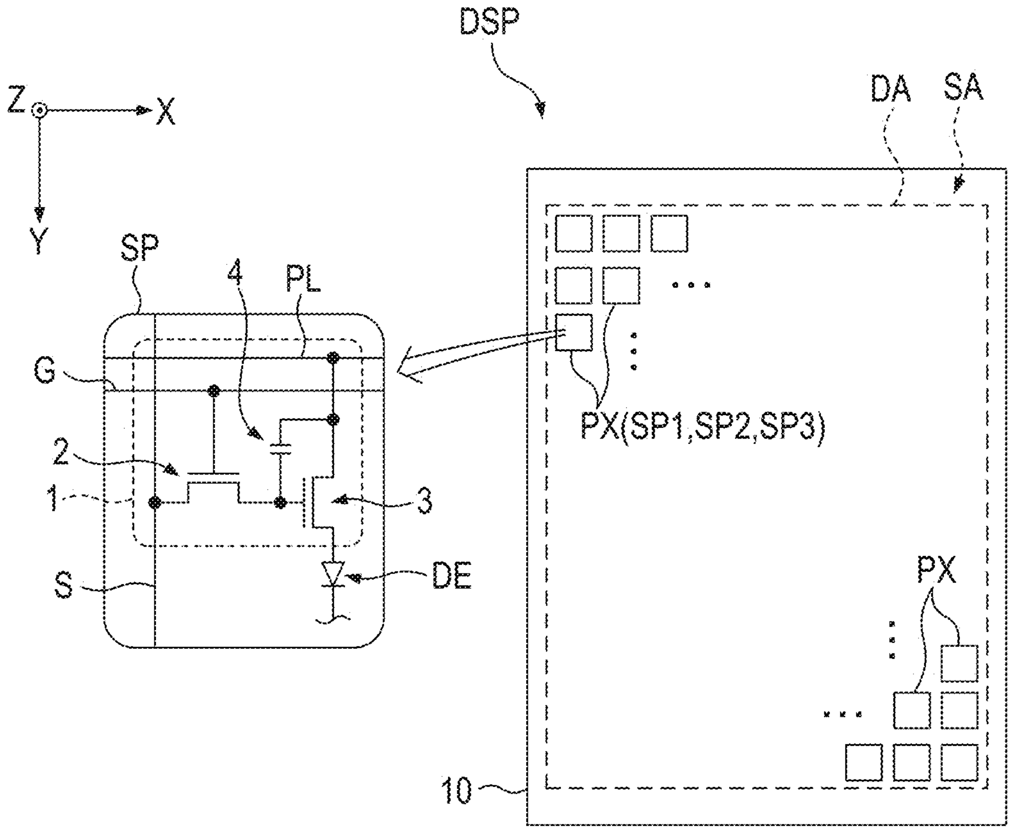
FIG. 1 is a diagram showing a configuration example of a display device according to a first embodiment.

In general, according to one embodiment, a display device comprises a base electrode including a first reflective layer, a lower electrode including a second reflective layer and provided on the base electrode, and a rib which covers an edge portion of the base electrode and has a pixel aperture overlapping the lower electrode. Further, a width of the base electrode is greater than a width of the lower electrode.

According to another embodiment, a manufacturing method of a display device includes forming a first layer including a first reflective layer, forming a second layer including a second reflective layer on the first layer, forming a lower electrode by applying first etching to the second layer, forming a base electrode having a width greater than a width of the lower electrode by applying second etching to the first layer, and forming a rib which covers an edge portion of the base electrode and has a pixel aperture overlapping the lower electrode.

The embodiments can provide a display device having an improved electrode structure and a manufacturing method of such a display device.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as an X-direction. A direction parallel to the Y-axis is referred to as a Y-direction. A direction parallel to the Z-axis is referred to as a Z-direction. The Z-direction is the normal direction of a plane including the X-direction and the Y-direction. When various elements are viewed parallel to the Z-direction, the appearance is defined as a plan view.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises an insulating substrate 10. The substrate 10 has a display area DA which displays an image, and a surrounding area SA around the display area DA. The substrate 10 may be glass or a resinous film having flexibility.

In this embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in an X-direction and a Y-direction. Each pixel includes a plurality of subpixels SP which display different colors. This embodiment assumes a case where each pixel PX includes a blue subpixel SP1, a green subpixel SP2 and a red subpixel SP3. However, each pixel PX may include a subpixel SP which exhibits another color such as white in addition to subpixels SP1, SP2 and SP3 or instead of one of subpixels SP1, SP2 and SP3.

Each subpixel SP comprises a pixel circuit 1 and a display element DE driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

In the display area DA, a plurality of scanning lines G which supply a scanning signal to the pixel circuit 1 of each subpixel SP, a plurality of signal lines S which supply a video signal to the pixel circuit 1 of each subpixel SP and a plurality of power lines PL are provided. In the example of FIG. 1, the scanning lines G and the power lines PL extend in the X-direction, and the signal lines S extend in the Y-direction.

The gate electrode of the pixel switch 2 is connected to the scanning line G. One of the source electrode and drain electrode of the pixel switch 2 is connected to the signal line S. The other one is connected to the gate electrode of the drive transistor 3 and the capacitor 4. In the drive transistor 3, one of the source electrode and the drain electrode is connected to the power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
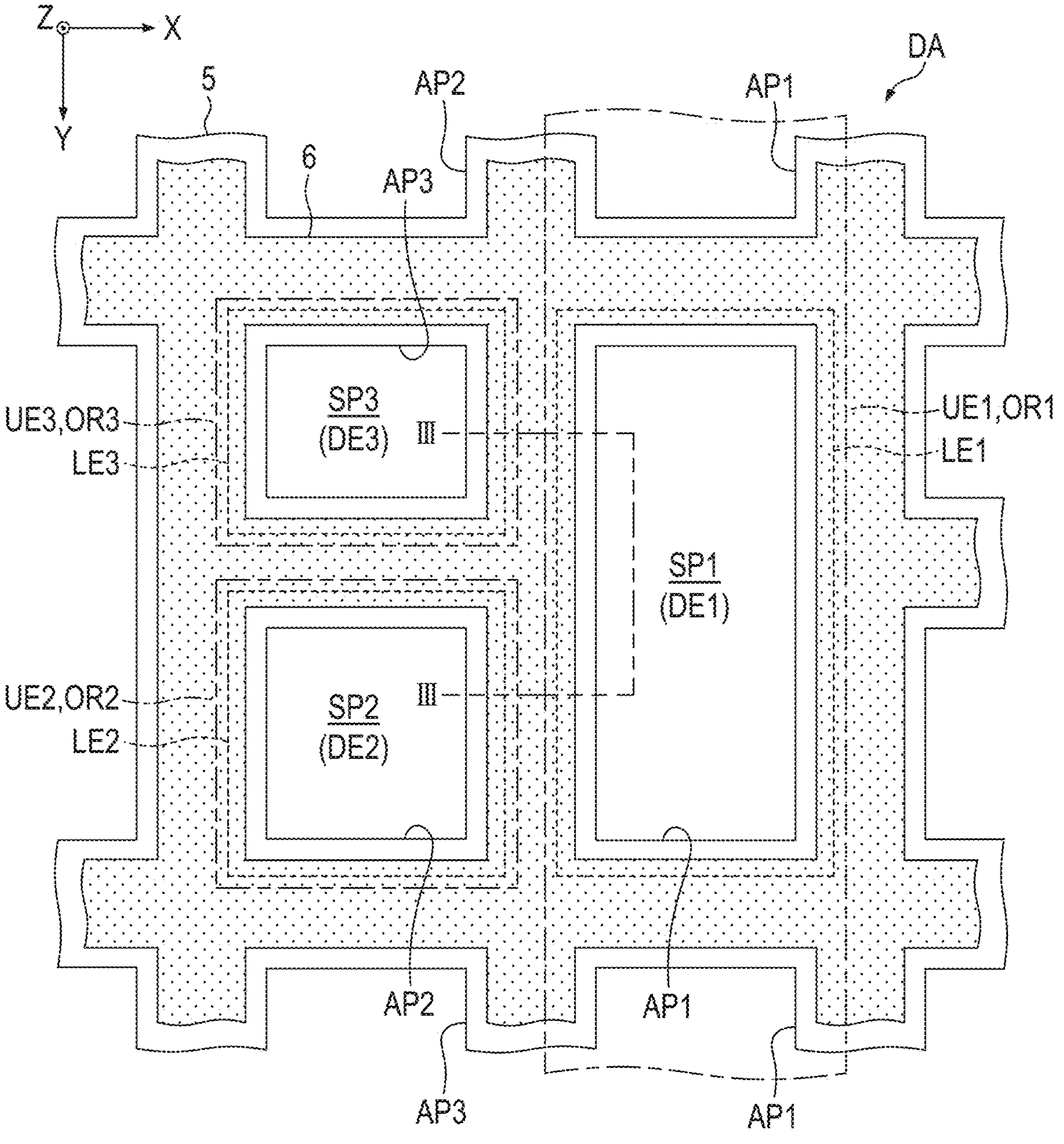
FIG. 2 is a schematic plan view showing an example of the layout of subpixels according to the first embodiment.

FIG. 2 is a schematic plan view showing an example of the layout of subpixels SP1, SP2 and SP3. In the example of FIG. 2, each of subpixels SP2 and SP3 is adjacent to subpixel SP1 in the X-direction. Further, subpixels SP2 and SP3 are arranged in the Y-direction.

When subpixels SP1, SP2 and SP3 are provided in line with this layout, a column in which subpixels SP2 and SP3 are alternately provided in the Y-direction and a column in which a plurality of subpixels SP1 are repeatedly provided in the Y-direction are formed in the display area DA. These columns are alternately arranged in the X-direction. It should be noted that the layout of subpixels SP1, SP2 and SP3 is not limited to the example of FIG. 2. Various other types of layouts can be applied.

A rib 5 is provided in the display area DA. The rib 5 has pixel apertures AP1, AP2 and AP3 in subpixels SP1, SP2 and SP3, respectively. In the example of FIG. 2, the pixel aperture AP1 is larger than the pixel aperture AP2. The pixel aperture AP2 is larger than the pixel aperture AP3. Thus, among subpixels SP1, SP2 and SP3, the aperture ratio of subpixel SP1 is the highest, and the aperture ratio of subpixel SP3 is the lowest.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3.

Of the lower electrode LE1, the upper electrode UE1 and the organic layer OR1, the portions which overlap the pixel aperture AP1 constitute the display element DE1 of subpixel SP1. Of the lower electrode LE2, the upper electrode UE2 and the organic layer OR2, the portions which overlap the pixel aperture AP2 constitute the display element DE2 of subpixel SP2. Of the lower electrode LE3, the upper electrode UE3 and the organic layer OR3, the portions which overlap the pixel aperture AP3 constitute the display element DE3 of subpixel SP3. Each of the display elements DE1, DE2 and DE3 may further include a cap layer and a base electrode as described later. The rib 5 surrounds each of the display elements DE1, DE2 and DE3.

A conductive partition 6 is provided on the rib 5. The partition 6 overlaps the rib 5 as a whole and has a planar shape similar to that of the rib 5. In other words, the partition 6 has an aperture in each of subpixels SP1, SP2 and SP3. From another viewpoint, each of the rib 5 and the partition 6 has a grating shape as seen in plan view and surrounds each of the pixel apertures AP1, AP2 and AP3. The partition 6 functions as lines which apply common voltage to the upper electrodes UE1, UE2 and UE3.

Figure 3:
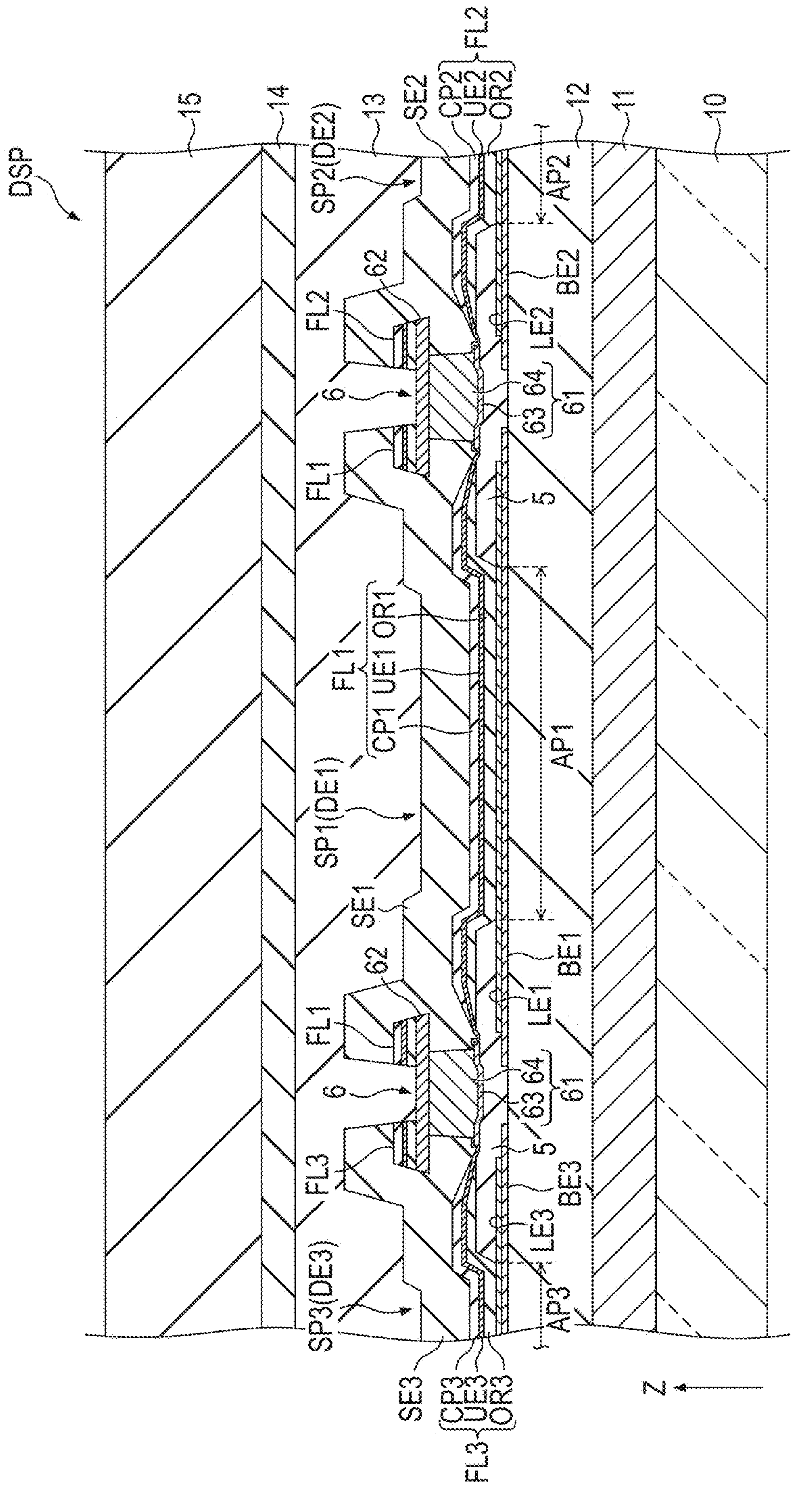
FIG. 3 is a schematic cross-sectional view of the display device along the III-III line of FIG. 2.

FIG. 3 is a schematic cross-sectional view of the display device DSP along the III-III line of FIG. 2. A circuit layer 11 is provided on the substrate 10 described above. The circuit layer 11 includes various circuits and lines such as the pixel circuits 1, scanning lines G, signal lines S and power lines PL shown in FIG. 1. The circuit layer 11 is covered with an organic insulating layer 12. The organic insulating layer 12 functions as a planarization film which planarizes the irregularities formed by the circuit layer 11.

In this embodiment, base electrodes BE1, BE2 and BE3 are provided on the organic insulating layer 12. The lower electrode LE1 is provided on the base electrode BE1. The lower electrode LE2 is provided on the base electrode BE2. The lower electrode LE3 is provided on the base electrode BE3. In the example of FIG. 3, the edge portions of the base electrodes BE1, BE2 and BE3 protrude from the lower electrodes LE1, LE2 and LE3, respectively.

The rib 5 covers the edge portions of the lower electrodes LE1, LE2 and LE3. The rib 5 also covers the edge portions of the base electrodes BE1, BE2 and BE3 protruding from the lower electrodes LE1, LE2 and LE3. Further, the rib 5 covers the organic insulating layer 12 between the base electrodes BE1, BE2 and BE3. Although not shown in the section of FIG. 3, the lower electrodes LE1, LE2 and LE3 and the base electrodes BE1, BE2 and BE3 are connected to the respective pixel circuits 1 of the circuit layer 11 through respective contact holes provided in the organic insulating layer 12.

The partition 6 includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6 is called an overhang shape.

In the example of FIG. 3, the lower portion 61 has a bottom layer 63 provided on the rib 5, and a stem layer 64 provided on the bottom layer 63. For example, the bottom layer 63 is formed so as to be thinner than the stem layer 64. In the example of FIG. 3, the both end portions of the bottom layer 63 protrude from the side surfaces of the stem layer 64. However, the both end portions of the bottom layer 63 may be aligned with the side surfaces of the stem layer 64. It should be noted that the lower portion 61 may not have the bottom layer 63. Alternatively, the lower portion 61 may comprise a multilayer structure consisting of three or more layers.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the lower portions 61 of the partition 6.

The display element DE1 includes a cap layer CP1 provided on the upper electrode UE1. The display element DE2 includes a cap layer CP2 provided on the upper electrode UE2. The display element DE3 includes a cap layer CP3 provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film FL1. A multilayer body including the organic layer OR2, the upper electrode UE2 and the cap layer CP2 is called a stacked film FL2. A multilayer body including the organic layer OR3, the upper electrode UE3 and the cap layer CP3 is called a stacked film FL3.

The stacked film FL1 is partly located on the upper portion 62. This portion is spaced apart from, of the stacked film FL1, the portion located under the partition 6 (in other words, the portion which constitutes the display element DE1). Similarly, the stacked film FL2 is partly located on the upper portion 62. This portion is spaced apart from, of the stacked film FL2, the portion located under the partition 6 (in other words, the portion which constitutes the display element DE2). Further, the stacked film FL3 is partly located on the upper portion 62. This portion is spaced apart from, of the stacked film FL3, the portion located under the partition 6 (in other words, the portion which constitutes the display element DE3).

Sealing layers SE1, SE2 and SE3 are provided in subpixels SP1, SP2 and SP3, respectively. The sealing layer SE1 continuously covers the cap layer CP1 and the partition 6 around subpixel SP1. The sealing layer SE2 continuously covers the cap layer CP2 and the partition 6 around subpixel SP2. The sealing layer SE3 continuously covers the cap layer CP3 and the partition 6 around subpixel SP3.

In the example of FIG. 3, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

The sealing layers SE1, SE2 and SE3 are covered with a resin layer 13. The resin layer 13 is covered with a sealing layer 14. The sealing layer 14 is covered with a resin layer 15. The resin layers 13 and 15 and the sealing layer 14 are continuously provided in at least the entire display area DA and partly extend in the surrounding area SA as well.

A cover member such as a polarizer, a touch panel, a protective film or a cover glass may be further provided above the resin layer 15. This cover member may be attached to the resin layer 15 via, for example, an adhesive layer such as an optical clear adhesive (OCA).

The organic insulating layer 12 is formed of an organic insulating material such as polyimide. Each of the rib 5 and the sealing layers 14, SE1, SE2 and SE3 is formed of an inorganic insulating material such as silicon nitride (SiNx), silicon oxide (SiOx), silicon oxynitride (SiON) or aluminum oxide ($Al_2O_3$). For example, the rib 5 is formed of silicon oxide or silicon oxynitride, and each of the sealing layers 14, SE1, SE2 and SE3 is formed of silicon nitride. Each of the resin layers 13 and 15 is formed of, for example, a resinous material (organic insulating material) such as epoxy resin or acrylic resin.

Each of the upper electrodes UE1, UE2 and UE3 is formed of, for example, a metal material such as an alloy of magnesium and silver (MgAg). For example, the stacked bodies of the base electrodes BE1, BE2 and BE3 and the lower electrodes LE1, LE2 and LE3 correspond to anodes, and the upper electrodes UE1, UE2 and UE3 correspond to cathodes.

Each of the organic layers OR1, OR2 and OR3 consists of a plurality of thin films including a light emitting layer. For example, each of the organic layers OR1, OR2 and OR3 comprises a structure in which a hole injection layer, a hole transport layer, an electron blocking layer, a light emitting layer, a hole blocking layer, an electron transport layer and an electron injection layer are stacked in order in a Z-direction. It should be noted that each of the organic layers OR1, OR2 and OR3 may comprise another structure such as a tandem structure including a plurality of light emitting layers.

Each of the cap layers CP1, CP2 and CP3 comprises, for example, a multilayer structure in which a plurality of transparent layers are stacked. These transparent layers could include a layer formed of an inorganic material and a layer formed of an organic material. The transparent layers have refractive indices different from each other. For example, the refractive indices of these transparent layers are different from the refractive indices of the upper electrodes UE1, UE2 and UE3 and the refractive indices of the sealing layers SE1, SE2 and SE3. It should be noted that at least one of the cap layers CP1, CP2 and CP3 may be omitted.

Each of the bottom layer 63 and stem layer 64 of the partition 6 is formed of a metal material. For the metal material of the bottom layer 63, for example, molybdenum, titanium, titanium nitride (TiN), a molybdenum-tungsten alloy (MoW) or a molybdenum-niobium alloy (MoNb) can be used. For the metal material of the stem layer 64, for example, aluminum, an aluminum-neodymium alloy (AlNd), an aluminum-yttrium alloy (AlY) or an aluminum-silicon alloy (AlSi) can be used. It should be noted that the stem layer 64 may be formed of an insulating material.

For example, the upper portion 62 of the partition 6 comprises a multilayer structure consisting of a lower layer formed of a metal material and an upper layer formed of a transparent oxide. For the metal material forming the lower layer, for example, titanium, titanium nitride, molybdenum, tungsten, a molybdenum-tungsten alloy or a molybdenum-niobium alloy can be used. For the transparent oxide forming the upper layer, for example, indium tin oxide (ITO) or indium zinc oxide (IZO) can be used. It should be noted that the upper portion 62 may comprise a single-layer structure of a metal material. The upper portion 62 may further include a layer formed of an insulating material.

Common voltage is applied to the partition 6. This common voltage is applied to each of the upper electrodes UE1, UE2 and UE3 which are in contact with the side surfaces of the lower portions 61. Pixel voltage is applied to the lower electrodes LE1, LE2 and LE3 and the base electrodes BE1, BE2 and BE3 through the pixel circuits 1 provided in subpixels SP1, SP2 and SP3, respectively, based on the video signals of the signal lines S.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 4:
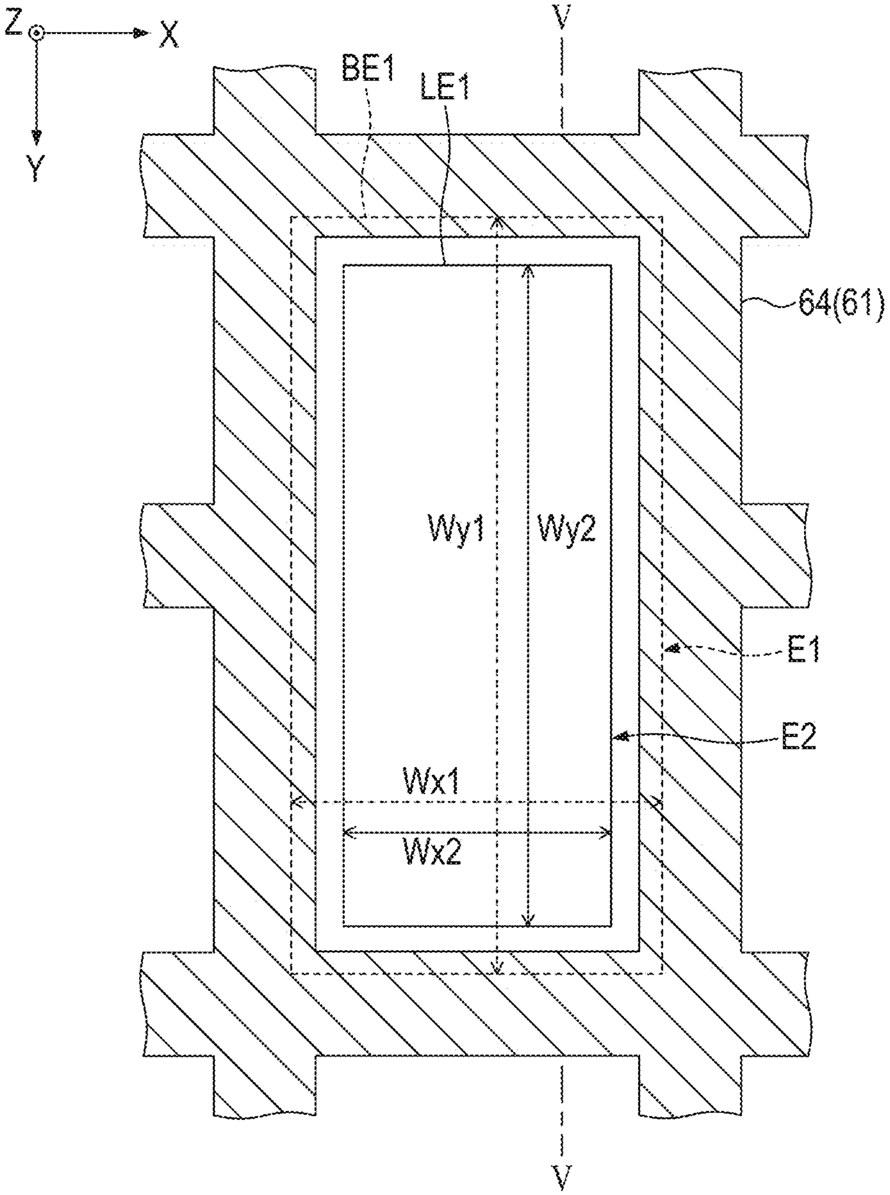
FIG. 4 is a schematic plan view of a base electrode, a lower electrode and the stem layer of a partition according to the first embodiment.

FIG. 4 is a schematic plan view of the base electrode BE1, the lower electrode LE1 and the stem layer 64 of the partition 6. In this figure, the stem layer 64 is shown by the pattern of hatch lines, and the outer shape of the base electrode BE1 is shown by broken lines.

In the example of FIG. 4, the base electrode BE1 has a rectangular edge portion E1 as seen in plan view, and the lower electrode LE1 has a rectangular edge portion E2 as seen in plan view. It should be noted that the shape of the edge portion E1 or E2 is not limited to a rectangle.

The base electrode BE1 has width Wx1 in the X-direction and width Wy1 in the Y-direction. The lower electrode LE1 has width Wx2 in the X-direction and width Wy2 in the Y-direction. In this embodiment, width Wx1 is greater than width Wx2 (Wx1>Wx2). Width Wy1 is greater than width Wy2 (Wy1>Wy2). By this configuration, the vicinity of the edge portion E1 of the base electrode BE1 protrudes from the lower electrode LE1.

In the example of FIG. 4, the edge portion E1 of the base electrode BE1 entirely overlaps the stem layer 64. To the contrary, the edge portion E2 of the lower electrode LE1 does not overlap the stem layer 64. As another example, at least part of the edge portion E1 may not overlap the stem layer 64. At least part of the edge portion E2 may overlap the stem layer 64.

Figure 5:
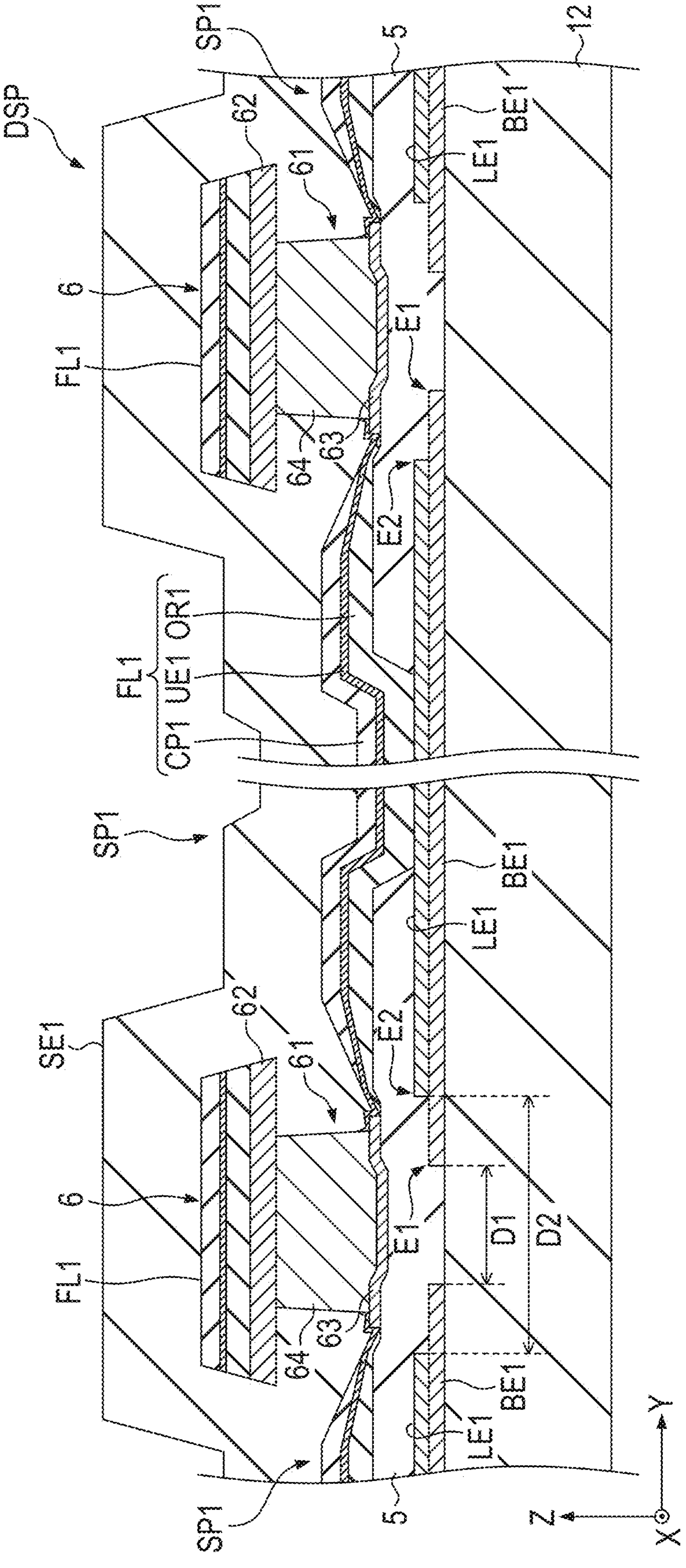
FIG. 5 is a schematic cross-sectional view of the display device along the V-V line of FIG. 4.

FIG. 5 is a schematic cross-sectional view of the display device DSP along the V-V line of FIG. 4. In this figure, the substrate 10, the circuit layer 11, the resin layer 13, the sealing layer 14 and the resin layer 15 are omitted.

Each of the two partitions 6 of the figure is located between subpixels SP1 which are adjacent to each other in the Y-direction. In the example of FIG. 5, each of the upper portions 62 of these partitions 6 is entirely covered with the stacked film FL1 and the sealing layer SE1. As another example, the stacked film FL1 and the sealing layer SE1 may be divided on the upper portions 62 of these partitions 6.

The edge portions E1 of the base electrode BE1 and the edge portions E2 of the lower electrode LE1 are covered with the rib 5. The rib 5 formed of an inorganic material is formed so as to be thinner than the organic insulating layer 12 etc. Therefore, steps corresponding to the edge portions E1 and E2 are formed on the surface of the rib 5. In the example of FIG. 5, the edge portions E1 are located under the stem layers 64. Thus, the steps caused by the edge portions E1 are covered with the bottom layers 63 and the stem layers 64.

The adjacent base electrodes BE1 are spaced apart from each other at distance D1. The adjacent lower electrodes LE1 are spaced apart from each other at distance D2. Distance D1 is less than distance D2 (D1<D2). For example, distance D2 is greater than or equal to 5 μm, and distance D1 is less than or equal to 3 μm.

It should be noted that a configuration similar to that of the base electrodes BE1 and the lower electrodes LE1 shown in FIG. 4 and FIG. 5 can be applied to the configuration of the base electrodes BE2 and the lower electrodes LE2 and the configuration of the base electrodes BE3 and the lower electrodes LE3. For example, adjacent two base electrodes of the base electrodes BE1, BE2 and BE3 are spaced apart from each other at the above distance D1. In addition, adjacent two lower electrodes of the lower electrodes LE1, LE2 and LE3 are spaced apart from each other at the above distance D2. It should be noted that the distance between adjacent two base electrodes of the base electrodes BE1, BE2 and BE3 may not be necessarily the same at all positions. In addition, the distance between adjacent two lower electrodes of the lower electrodes LE1, LE2 and LE3 may not be necessarily the same at all positions.

FIG. 6 to FIG. 9 are schematic cross-sectional views of layer configurations which can be applied to the base electrode BE1 and the lower electrode LE1. The layer configurations shown in these drawings can be also applied to the base electrodes BE2 and BE3 and the lower electrodes LE2 and LE3.

In all of FIG. 6 to FIG. 9, the base electrode BE1 includes a first reflective layer RF1, and the lower electrode LE1 includes a second reflective layer RF2. Each of these reflective layers RF1 and RF2 is formed of a metal material having an excellent reflectance for visible light. Part of the light emitted by the organic layer OR1 is reflected on the second reflective layer RF2. Further, at least part of the light which passed through the second reflective layer RF2 is reflected on the first reflective layer RF1.

This embodiment assumes a case where the first reflective layer RF1 is formed of aluminum (Al) or an aluminum alloy, and the second reflective layer RF2 is formed of silver (Ag). It should be noted that another type of metal or metal alloy may be used for each of the reflective layers RF1 and RF2.

Figure 6:
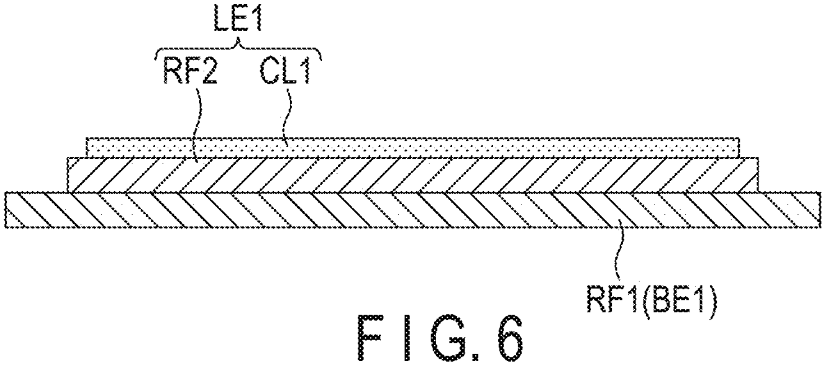
FIG. 6 is a schematic cross-sectional view of a layer configuration which can be applied to the base electrode and the lower electrode according to the first embodiment.

In the example of FIG. 6, the base electrode BE1 has a single-layer structure consisting of the first reflective layer RF1. To the contrary, the lower electrode LE1 includes the second reflective layer RF2 and a first transparent oxide layer CL1 which covers the upper surface of the second reflective layer RF2. The lower surface of the second reflective layer RF2 is in contact with the upper surface of the first reflective layer RF1.

The first transparent oxide layer CL1 is formed of, for example, ITO or IZO, and functions as a hole injection electrode for the hole injection layer of the organic layer OR1. The first transparent oxide layer CL1 is, for example, thinner than the second reflective layer RF2.

Figure 7:
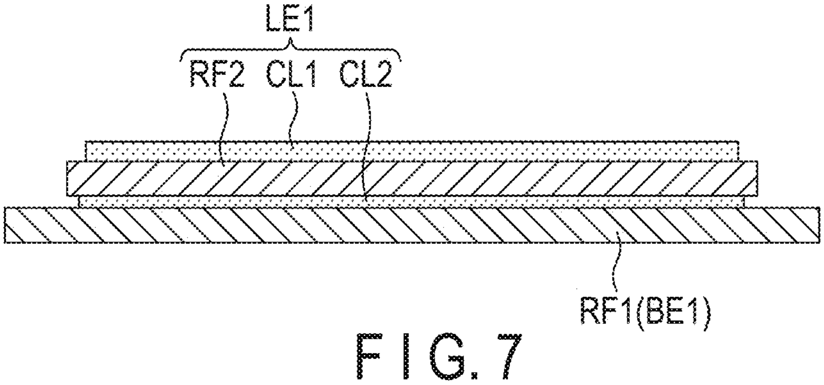
FIG. 7 is a schematic cross-sectional view of another layer configuration which can be applied to the base electrode and the lower electrode.

In the example of FIG. 7, the lower electrode LE1 further includes a second transparent oxide layer CL2 which covers the lower surface of the second reflective layer RF2. The second transparent oxide layer CL2 is in contact with the upper surface of the first reflective layer RF1. The second transparent oxide layer CL2 is formed of, for example, ITO or IZO.

There is a possibility that the second reflective layer RF2 which is silver does not exert a sufficient adherence for the first reflective layer RF1 which is aluminum or an aluminum alloy. By providing the second transparent oxide layer CL2 between the reflective layers RF1 and RF2, the adherence between the reflective layers RF1 and RF2 is improved.

As described in detail later in the explanation of FIG. 15, the reflectance of an anode in which the base electrode BE1 and the lower electrode LE1 are stacked is increased as the second transparent oxide layer CL2 is thinner. For this reason, the second transparent oxide layer CL2 should be preferably formed so as to be thinner than each of the reflective layers RF1 and RF2. For example, the thickness of the second transparent oxide layer CL2 is 5 to 10 nm.

In a case where, for example, the first reflective layer RF1 is formed of aluminum (pure aluminum), and the second transparent oxide layer CL2 is formed of ITO, a high connection resistance could be generated between the first reflective layer RF1 and the second transparent oxide layer CL2. To reduce this connection resistance, the first reflective layer RF1 should be preferably formed of an aluminum alloy such as an aluminum-nickel alloy (AlNi).

Figure 8:
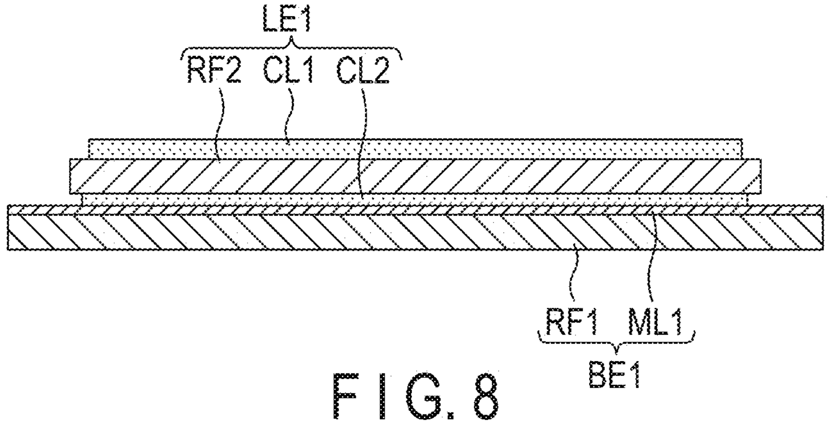
FIG. 8 is a schematic cross-sectional view of yet another layer configuration which can be applied to the base electrode and the lower electrode.

In the example of FIG. 8, the base electrode BE1 further includes a first metal layer ML1 which covers the upper surface of the first reflective layer RF1. The first metal layer ML1 is in contact with the second transparent oxide layer CL2. The first metal layer ML1 is formed of, for example, titanium nitride (TiN). By providing this first metal layer ML1, even when the first reflective layer RF1 is formed of aluminum, the connection resistance described above is improved.

As described in detail later in the explanation of FIG. 16, the reflectance of an anode in which the base electrode BE1 and the lower electrode LE1 are stacked is increased as the first metal layer ML1 is thinner. For this reason, the first metal layer ML1 should be preferably formed so as to be thinner than each of the reflective layers RF1 and RF2. For example, the thickness of the first metal layer ML1 is 5 to 10 nm.

Figure 9:
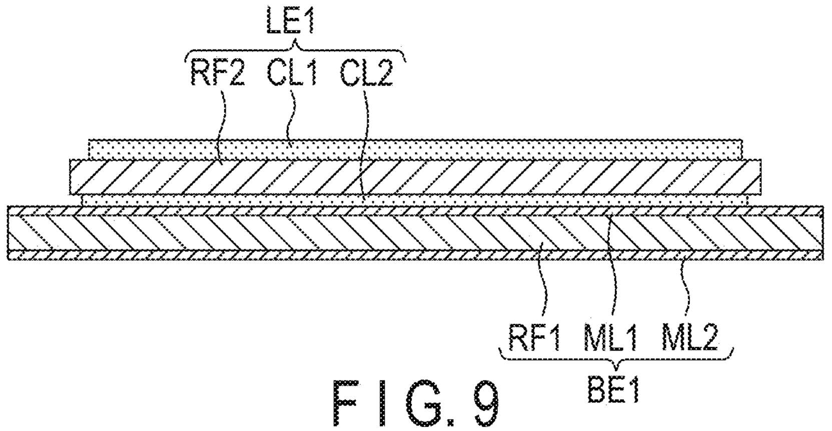
FIG. 9 is a schematic cross-sectional view of yet another layer configuration which can be applied to the base electrode and the lower electrode.

In the example of FIG. 9, the base electrode BE1 further includes a second metal layer ML2 which covers the lower surface of the first reflective layer RF1. The second metal layer ML2 is formed of, for example, titanium (Ti), and is in contact with the organic insulating layer 12 shown in FIG. 5. By providing this second metal layer ML2, the adherence between the first reflective layer RF1 and the organic insulating layer 12 is improved.

It should be noted that the second metal layer ML2 does not substantially have an effect on the optical properties or electrical properties of an anode in which the base electrode BE1 and the lower electrode LE1 are stacked. Thus, the second metal layer ML2 may be formed so as to be thicker than the first metal layer ML1. For example, the thickness of the second metal layer ML2 is 10 to 100 nm.

The thickness of each of the reflective layers RF1 and RF2, the metal layers ML1 and ML2 and the transparent oxide layers CL1 and CL2 can be appropriately determined in consideration of the reflectance, the total thickness of the layers and the like. For example, the thickness of each of the reflective layers RF1 and RF2 is 30 nm. The thickness of the first metal layer ML1 is 5 nm. The thickness of the second metal layer ML2 is 10 nm. The thickness of the first transparent oxide layer CL1 is 25 nm. The thickness of the second transparent oxide layer CL2 is 7 nm.

Figure 10:
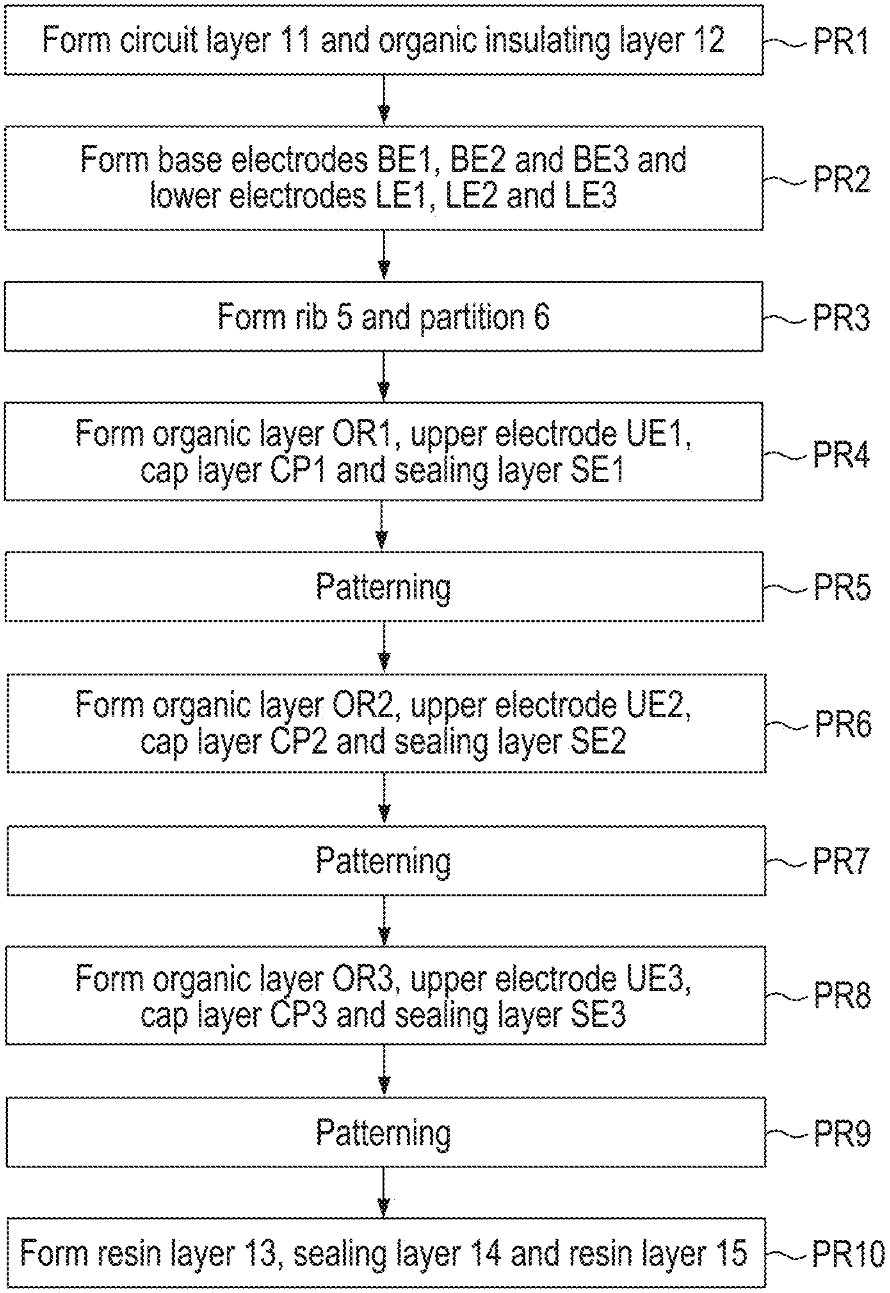
FIG. 10 is a flowchart showing an example of the manufacturing method of the display device according to the first embodiment.

FIG. 10 is a flowchart showing an example of the manufacturing method of the display device DSP. To manufacture the display device DSP, first, the circuit layer 11 and the organic insulating layer 12 are formed on the substrate 10 (process PR1). Subsequently, the base electrodes BE1, BE2 and BE3 and the lower electrodes LE1, LE2 and LE3 are formed on the organic insulating layer 12 (process PR2).

FIG. 11A to FIG. 11G are schematic cross-sectional views showing an example of the process of forming the base electrodes BE1, BE2 and BE3 and the lower electrodes LE1, LE2 and LE3. Here, this specification assumes a case where the base electrodes BE1, BE2 and BE3 and the lower electrodes LE1, LE2 and LE3 comprise the structure shown in FIG. 9. In FIG. 11A to FIG. 11G, the substrate 10 and the circuit layer 11 are omitted.

Figure 11A:
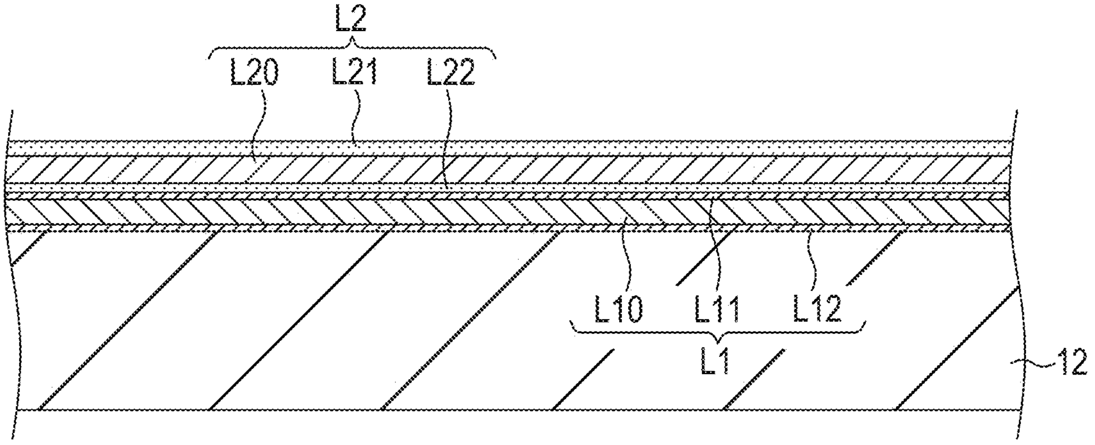
FIG. 11A is a schematic cross-sectional view showing an example of the process of forming the base electrodes and the lower electrodes.

In process PR2, first, as shown in FIG. 11A, a first layer L1 which is processed so as to be the base electrodes BE1, BE2 and BE3 and a second layer L2 which is processed so as to be the lower electrodes LE1, LE2 and LE3 are formed on the organic insulating layer 12.

The first layer L1 includes a first reflective layer L10, a first metal layer L11 which covers the upper surface of the first reflective layer L10, and a second metal layer L12 which covers the lower surface of the first reflective layer L10. The materials of these first reflective layer L10, first metal layer L11 and second metal layer L12 are the same as the materials described above as the materials of the first reflective layer RF1, the first metal layer ML1 and the second metal layer ML2. For example, sputtering is used to form the first reflective layer L10, the first metal layer L11 and the second metal layer L12.

The second layer L2 includes a second reflective layer L20, a first transparent oxide layer L21 which covers the upper surface of the second reflective layer L20, and a second transparent oxide layer L22 which covers the lower surface of the second reflective layer L20. The materials of these second reflective layer L20, first transparent oxide layer L21 and second transparent oxide layer L22 are the same as the materials described above as the materials of the second reflective layer RF2, the first transparent oxide layer CL1 and the second transparent oxide layer CL2. For example, sputtering is used to form the second reflective layer L20, the first transparent oxide layer L21 and the second transparent oxide layer L22.

Figure 11B:
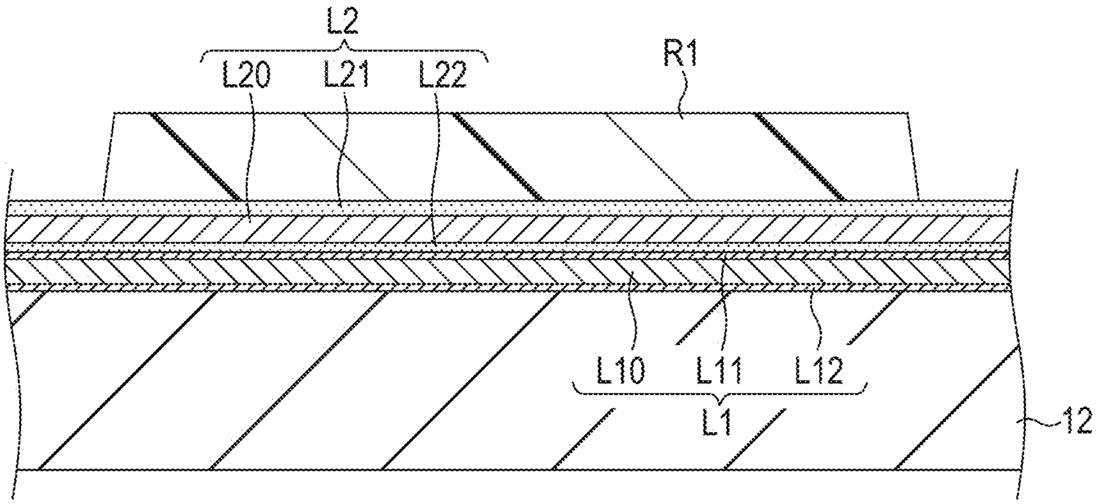
FIG. 11B is a schematic cross-sectional view of a process following FIG. 11A.

After the formation of the first layer L1 and the second layer L2, a resist R1 is provided on the second layer L2 as shown in FIG. 11B. The resist R1 is patterned into, for example, the shapes of the base electrodes BE1, BE2 and BE3.

After the formation of the resist R1, first etching for removing the portion of the second layer L2 exposed from the resist R1 is performed. The first etching includes wet etching (FIG. 11C) for the first transparent oxide layer L21, wet etching (FIG. 11D) for the second reflective layer L20 and wet etching (FIG. 11E) for the second transparent oxide layer L22.

Figure 11C:
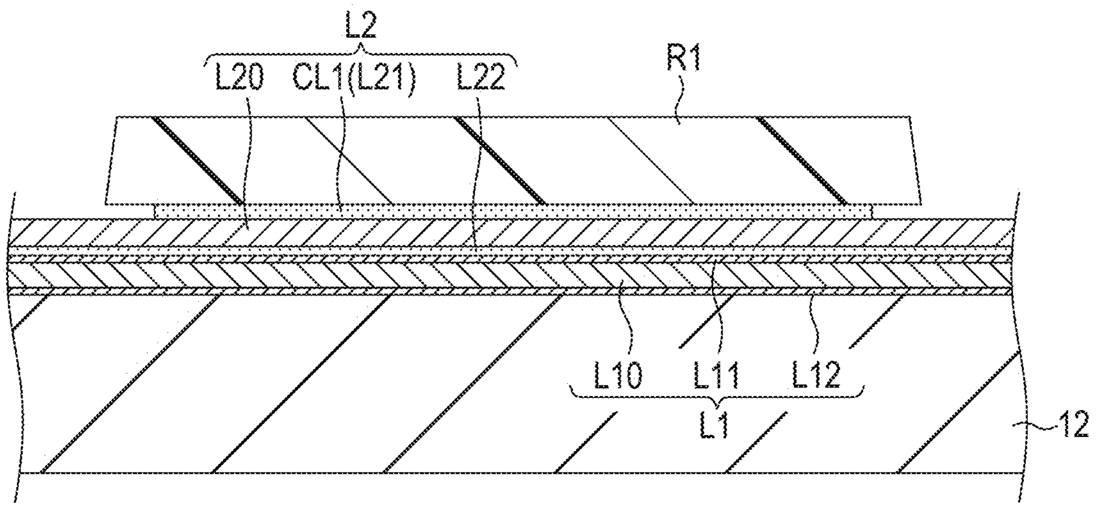
FIG. 11C is a schematic cross-sectional view of a process following FIG. 11B.

In the wet etching for the first transparent oxide layer L21, the portion of the first transparent oxide layer L21 exposed from the resist R1 is removed as shown in FIG. 11C. By this process, the first transparent oxide layer CL1 of each of the lower electrodes LE1, LE2 and LE3 is formed. In the example of FIG. 11C, the width of the first transparent oxide layer CL1 is slightly reduced compared to the width of the resist R1.

Figure 11D:
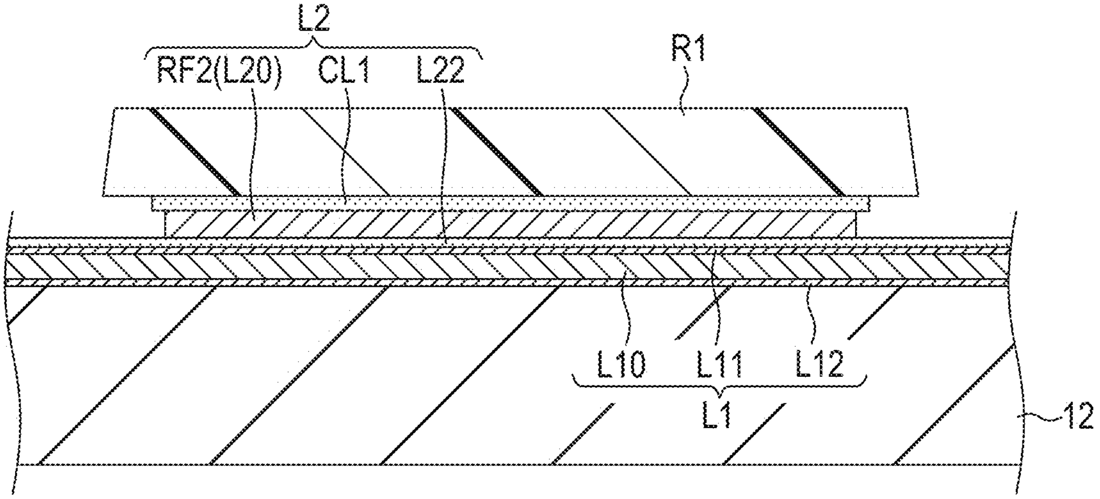
FIG. 11D is a schematic cross-sectional view of a process following FIG. 11C.

In the wet etching for the second reflective layer L20, the portion of the second reflective layer L20 exposed from the resist R1 is removed as shown in FIG. 11D. By this process, the second reflective layer RF2 of each of the lower electrodes LE1, LE2 and LE3 is formed. In the example of FIG. 11D, the width of the second reflective layer RF2 is slightly reduced compared to the width of the first transparent oxide layer CL1.

It should be noted that, in the wet etching for the second reflective layer L20, an etchant which does not easily dissolve the first reflective layer L10 should be preferably used to prevent the damage to the lower first reflective layer L10. For example, when the first reflective layer L10 is formed of aluminum or an aluminum alloy, a solution in which the concentration of nitric acid is greater than or equal to 20% may be used as the etchant. By this configuration, even if the second transparent oxide layer L22 and the first metal layer L11 are damaged by the wet etching which is applied so far, or even if a pinhole is formed in the second transparent oxide layer L22 and the first metal layer L11, the dissolution of the first reflective layer L10 can be prevented.

Figure 11E:
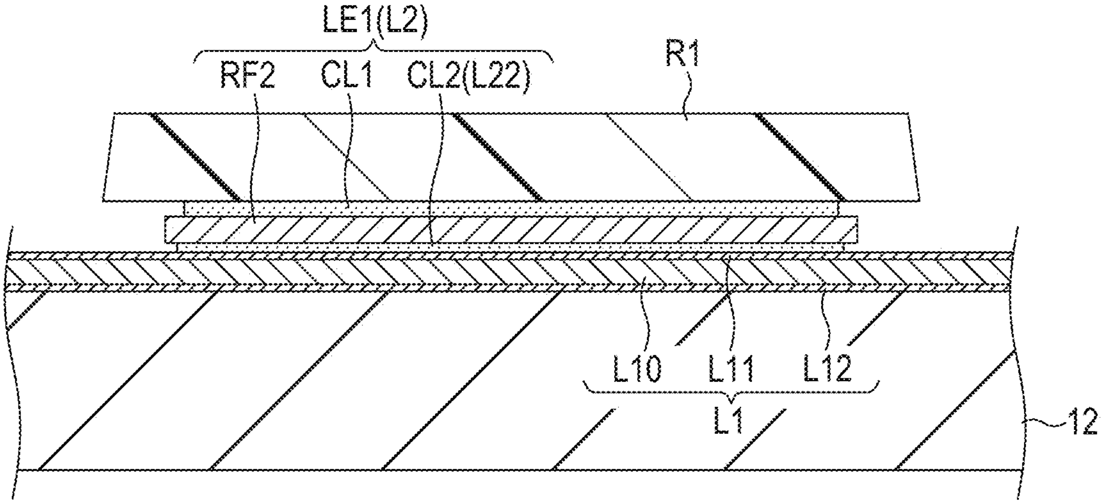
FIG. 11E is a schematic cross-sectional view of a process following FIG. 11D.

In the wet etching for the second transparent oxide layer L22, the portion of the second transparent oxide layer L22 exposed from the resist R1 is removed as shown in FIG. 11E. By this process, the second transparent oxide layer CL2 of each of the lower electrodes LE1, LE2 and LE3 is formed.

In the example of FIG. 11E, the width of the second transparent oxide layer CL2 is slightly reduced compared to the width of the second reflective layer RF2. In addition, in this wet etching, the end portion of the first transparent oxide layer CL1 could be eroded. By this process, the width of the first transparent oxide layer CL1 is slightly reduced compared to the width of the second reflective layer RF2 in the example of FIG. 11E.

Thus, the second layer L2 is patterned into the shapes of the lower electrodes LE1, LE2 and LE3 by the first etching shown in FIG. 11C to FIG. 11E. After the first etching, second etching for the first layer L1 is performed.

For example, the second etching is dry etching for processing the first reflective layer L10, the first metal layer L11 and the second metal layer L12 in a lump. As another example, the second etching may include a plurality of dry etching processes for individually processing the first reflective layer L10, the first metal layer L11 and the second metal layer L12.

Figure 11F:
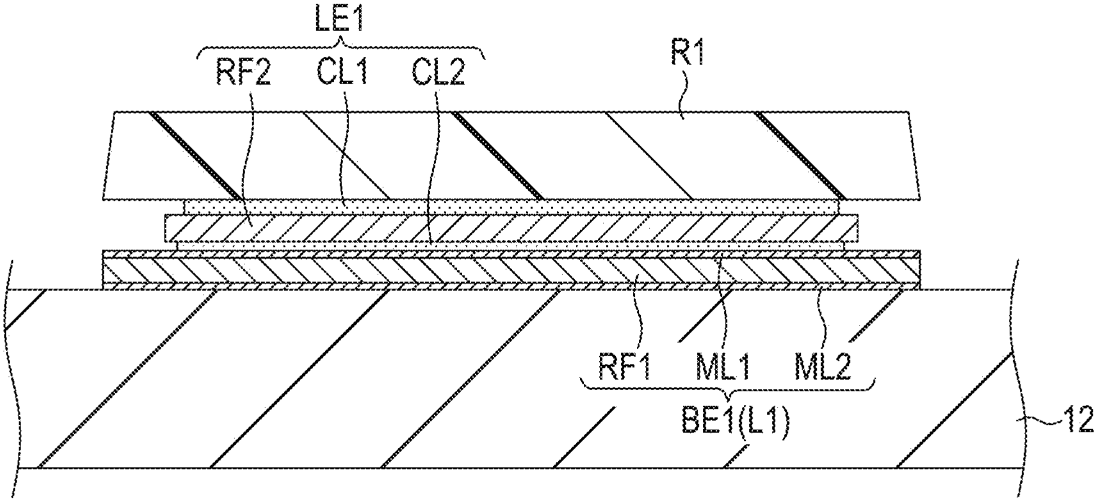
FIG. 11F is a schematic cross-sectional view of a process following FIG. 11E.
Figure 11G:
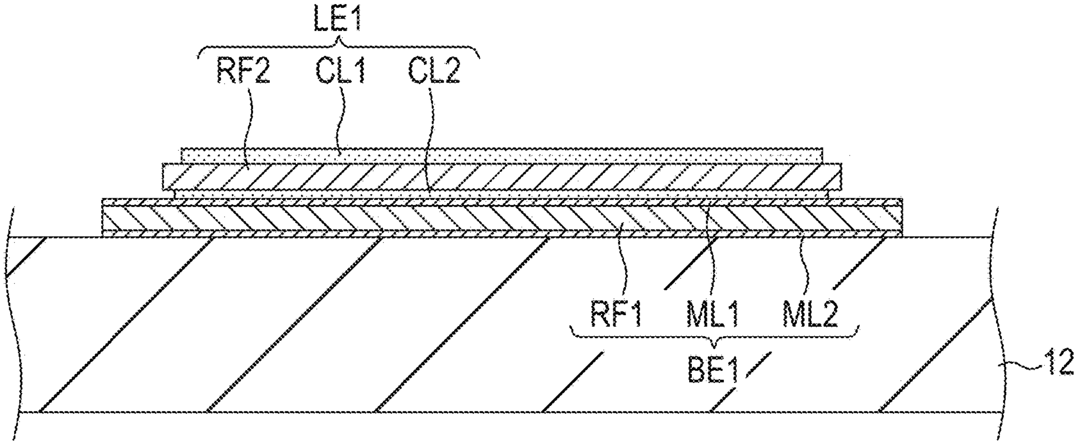
FIG. 11G is a schematic cross-sectional view of a process following FIG. 11F.

In the second etching, the portion of the first layer L1 exposed from the resist R1 is removed as shown in FIG. 11F. By this process, the first layer L1 is patterned into the shapes of the base electrodes BE1, BE2 and BE3. After the second etching, the resist R1 is removed as shown in FIG. 11G.

It should be noted that the second etching should be preferably dry etching in which the anisotropy is high. By this configuration, of the first layer L1, the portion located under the resist R1 is not easily eroded. Thus, the base electrodes BE1, BE2 and BE3 can be accurately formed.

After the base electrodes BE1, BE2 and BE3 and the lower electrodes LE1, LE2 and LE3 are formed as described above, the rib 5 and the partition 6 are formed (process PR3 of FIG. 10). In this process, first, an inorganic insulating layer which is processed so as to be the rib 5 is formed, and the partition 6 is formed on the inorganic insulating layer. Subsequently, the rib 5 is formed by providing the pixel apertures AP1, AP2 and AP3 in the inorganic insulating layer. As another example, the partition 6 may be formed after providing the pixel apertures AP1, AP2 and AP3 in the inorganic insulating layer.

After the formation of the rib 5 and the partition 6, a process for forming the display elements DE1, DE2 and DE3 is performed (processes PR4 to PR9 of FIG. 10). In the embodiment, this specification assumes a case where the display element DE1 is formed firstly, and the display element DE2 is formed secondly, and the display element DE3 is formed lastly. It should be noted that the formation order of the display elements DE1, DE2 and DE3 is not limited to this example.

FIG. 12A to FIG. 12E are schematic cross-sectional views showing an example of the process of forming the display elements DE1, DE2 and DE3. In these figures, the substrate 10 and the circuit layer 11 are omitted.

Figure 12A:
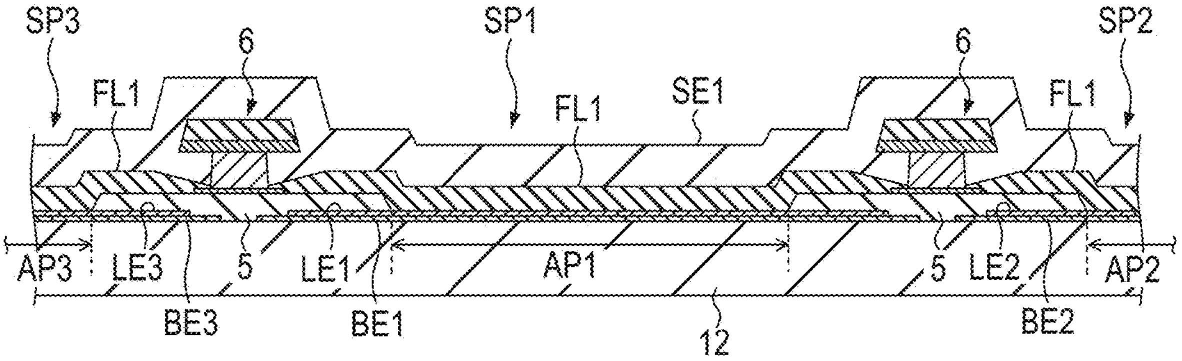
FIG. 12A is a schematic cross-sectional view showing an example of the process of forming display elements.

To form the display element DE1, first, as shown in FIG. 12A, the stacked film FL1 and the sealing layer SE1 are formed (process PR4). The stacked film FL1 includes, as shown in FIG. 3, the organic layer OR1 which is in contact with the lower electrode LE1 through the pixel aperture AP1, the upper electrode UE1 which covers the organic layer OR1, and the cap layer CP1 which covers the upper electrode UE1. The organic layer OR1, the upper electrode UE1 and the cap layer CP1 are formed by vapor deposition. The sealing layer SE1 is formed by chemical vapor deposition (CVD). The stacked film FL1 is divided into a plurality of portions by the partition 6 having an overhang shape. The sealing layer SE1 continuously covers the portions into which the stacked film FL1 is divided, and the partition 6.

Figure 12B:
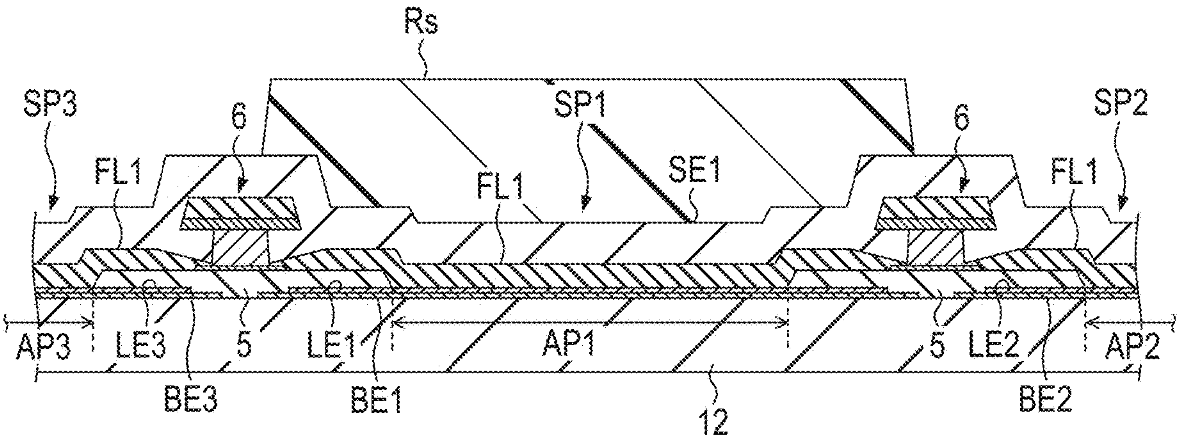
FIG. 12B is a schematic cross-sectional view of a process following FIG. 12A.

After process PR4, the stacked film FL1 and the sealing layer SE1 are patterned (process PR5). In this patterning, as shown in FIG. 12B, a resist Rs is provided on the sealing layer SE1. The resist Rs covers subpixel SP1 and part of the partition 6 around the subpixel.

Figure 12C:
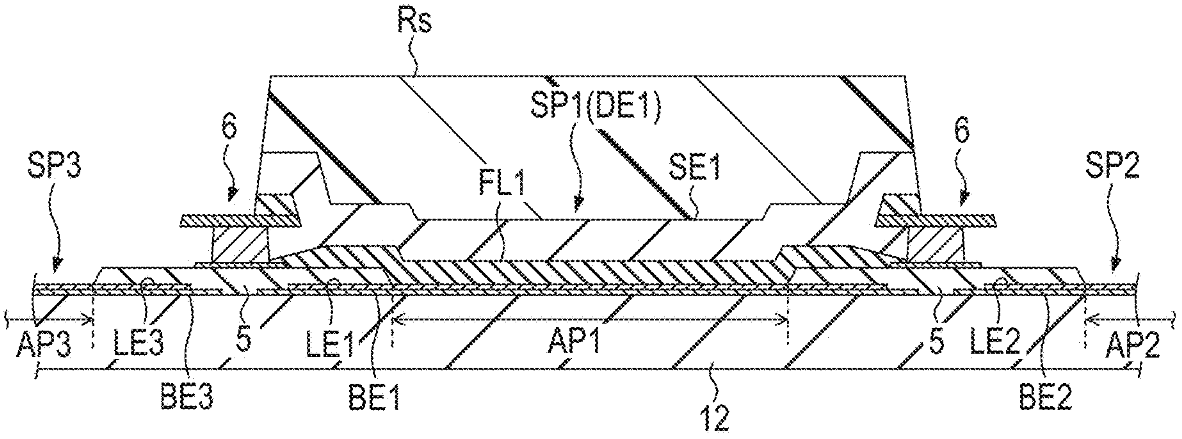
FIG. 12C is a schematic cross-sectional view of a process following FIG. 12B.

Subsequently, as shown in FIG. 12C, the portions of the stacked film FL1 and the sealing layer SE1 exposed from the resist Rs are removed by etching using the resist Rs as a mask. In other words, of the stacked film FL1 and the sealing layer SE1, the portions which overlap the lower electrode LE1 remain, and the other portions are removed. By this process, the display element DE1 is formed in subpixel SP1. For example, this etching includes wet etching and dry etching processes which are performed in order for the sealing layer SE1, the cap layer CP1, the upper electrode UE1 and the organic layer OR1. After these etching processes, the resist Rs is removed.

The display element DE2 is formed by a procedure similar to that of the display element DE1. Specifically, when the display element DE2 is formed, the stacked film FL2 and the sealing layer SE2 are formed in the entire display area DA (process PR6). The stacked film FL2 includes, as shown in FIG. 3, the organic layer OR2 which is in contact with the lower electrode LE2 through the pixel aperture AP2, the upper electrode UE2 which covers the organic layer OR2, and the cap layer CP2 which covers the upper electrode UE2.

The organic layer OR2, the upper electrode UE2 and the cap layer CP2 are formed by vapor deposition. The sealing layer SE2 is formed by CVD. The stacked film FL2 is divided into a plurality of portions by the partition 6 having an overhang shape. The sealing layer SE2 continuously covers the portions into which the stacked film FL2 is divided, and the partition 6.

Figure 12D:
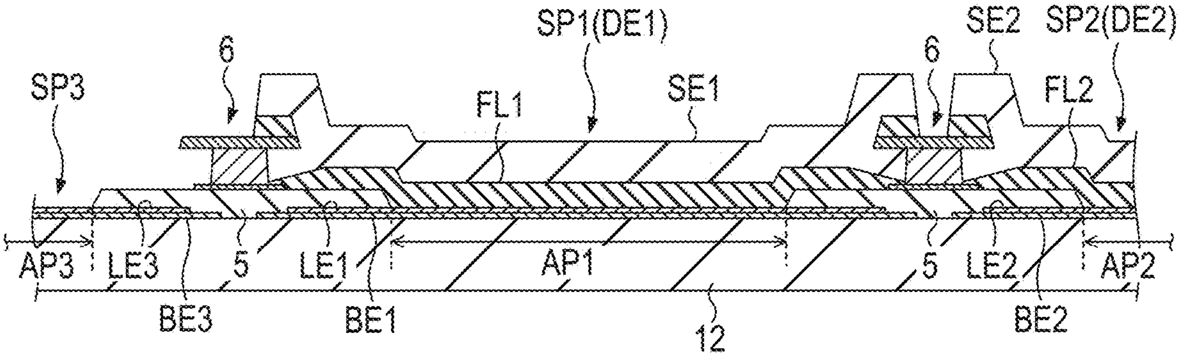
FIG. 12D is a schematic cross-sectional view of a process following FIG. 12C.

After process PR6, the stacked film FL2 and the sealing layer SE2 are patterned (process PR7). By this process, the display element DE2 is formed in subpixel SP2 as shown in FIG. 12D.

The display element DE3 is formed by a procedure similar to the procedures of the display elements DE1 and DE2. Specifically, when the display element DE3 is formed, the stacked film FL3 and the sealing layer SE3 are formed in the entire display area DA (process PR8). The stacked film FL3 includes, as shown in FIG. 3, the organic layer OR3 which is in contact with the lower electrode LE3 through the pixel aperture AP3, the upper electrode UE3 which covers the organic layer OR3, and the cap layer CP3 which covers the upper electrode UE3.

The organic layer OR3, the upper electrode UE3 and the cap layer CP3 are formed by vapor deposition. The sealing layer SE3 is formed by CVD. The stacked film FL3 is divided into a plurality of portions by the partition 6 having an overhang shape. The sealing layer SE3 continuously covers the portions into which the stacked film FL3 is divided, and the partition 6.

Figure 12E:
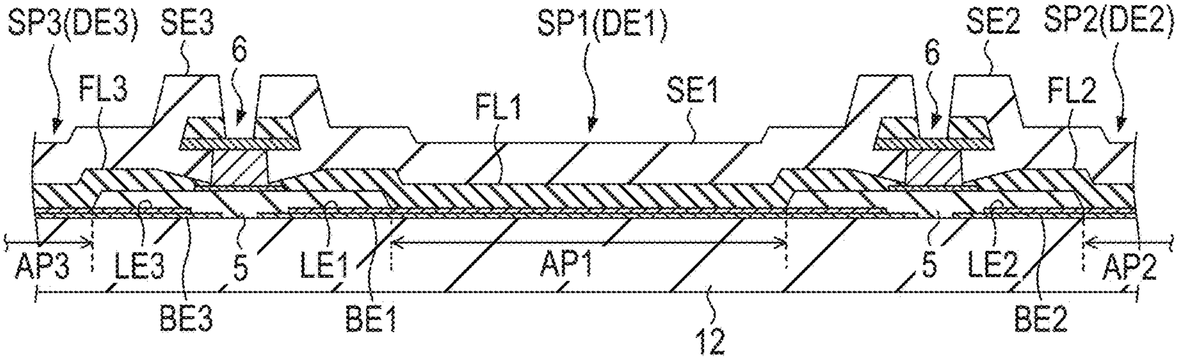
FIG. 12E is a schematic cross-sectional view of a process following FIG. 12D.

After process PR8, the stacked film FL3 and the sealing layer SE3 are patterned (process PR9). By this process, the display element DE3 is formed in subpixel SP3 as shown in FIG. 12E.

After the display elements DE1, DE2 and DE3 are formed, the resin layer 13, sealing layer 14 and resin layer 15 shown in FIG. 3 are formed in order (process PR10). The display device DSP is completed through this process.

Now, this specification explains the effects obtained by the display device DSP and the manufacturing method thereof in the embodiment. It should be noted that the effects shown here are merely examples. Various other effects could be obtained from the display device DSP of the embodiment and the manufacturing method thereof.

In this embodiment, the base electrodes BE1, BE2 and BE3 are provided under the lower electrodes LE1, LE2 and LE3. If the base electrode BE1, BE2 or BE3 is not provided, the light emitted by the organic layers OR1, OR2 and OR3 need to be reflected mainly on the second reflective layer RF2 of each of the lower electrodes LE1, LE2 and LE3. In this case, in order to obtain a sufficient reflectance, for example, the second reflective layer RF2 needs to have a thickness of approximately 100 nm. When the thickness of the second reflective layer RF2 is, for example, approximately 50 nm, part of light passes through the second reflective layer RF2, and the luminous efficiency of the display elements DE1, DE2 and DE3 could be reduced.

However, when the second reflective layer RF2 is thick, a large step is generated on the upper surface of the rib 5 which covers the end portion of the second reflective layer RF2. The upper electrodes UE1, UE2 and UE3 might be separated by the step, and thus, there is a possibility that a defect occurs in the conduction with the partition 6. In addition, a crack may be generated in the rib 5 near the edge portions of the thick lower electrodes LE1, LE2 and LE3.

In the embodiment, the base electrodes BE1, BE2 and BE3 each of which includes the first reflective layer RF1 are provided under the lower electrodes LE1, LE2 and LE3, respectively. In this configuration, the light of the organic layers OR1, OR2 and OR3 is reflected by the lower electrodes LE1, LE2 and LE3 and the base electrodes BE1, BE2 and BE3. In this manner, even when the lower electrodes LE1, LE2 and LE3 and the base electrodes BE1, BE2 and BE3 are formed so as to be thin, a sufficient reflectance can be obtained.

Moreover, as shown in FIG. 4 and FIG. 5, the width of the base electrode BE1 is greater than that of the lower electrode LE1. By this configuration, the edge portion E1 of the base electrode BE1 is not coincident with the edge portion E2 of the lower electrode LE1. In this configuration, the step generated on the upper surface of the rib 5 is dispersed to the upper side of the edge portion E1 and the upper side of the edge portion E2, and thus, a large step is not easily generated. In addition, in the embodiment, the edge portion E1 is located under the stem layer 64 of the partition 6. By this structure, the step generated in the rib 5 by the edge portion E1 is covered with the stem layer 64. For these reasons, the embodiment can improve the yield by preventing the discontinuity of the upper electrode UE1 and the generation of cracks in the rib 5. Similar effects are obtained with respect to the lower electrodes LE2 and LE3 and the base electrodes BE2 and BE3.

When, for example, the second reflective layer RF2 is formed of silver, it is difficult to manufacture the lower electrodes LE1, LE2 and LE3 by dry etching. However, if the lower electrodes LE1, LE2 and LE3 are manufactured by wet etching, the end surfaces of the lower electrodes LE1, LE2 and LE3 could be eroded such that the width is less than the resist used as a mask. For this reason, it is difficult to sufficiently reduce the interval between the adjacent lower electrodes LE1, LE2 and LE3, and thus, an interval of approximately 5 μm is the realistic minimum interval. Thus, the increase in the definition of the display device DSP could be restricted.

To the contrary, in the embodiment, the base electrodes BE1, BE2 and BE3 are manufactured by dry etching. In this case, the outer shapes of the base electrodes BE1, BE2 and BE3 can be accurately formed. For example, the interval of the base electrodes BE1, BE2 and BE3 can be made less than or equal to 3 μm. This configuration allows the anodes (the base electrodes and lower electrodes) of the display elements DE1, DE2 and DE3 to be arrayed at a narrow pitch, thereby realizing a high-definition display device DSP.

If the organic insulating layer 12 is exposed from the base electrodes BE1, BE2 and BE3 and the lower electrodes LE1, LE2 and LE3 in the pixel apertures AP1, AP2 and AP3 of the rib 5, the organic insulating layer 12 could be eroded by etching which is applied when the display elements DE1, DE2 and DE3 are formed, etc. Therefore, the pixel apertures AP1, AP2 and AP3 should preferably overlap the base electrodes BE1, BE2 and BE3 or the lower electrodes LE1, LE2 and LE3 as a whole.

If the base electrode BE1, BE2 or BE3 is not provided, the lower electrodes LE1, LE2 and LE3 need to certainly overlap the pixel apertures AP1, AP2 and AP3. In this regard, a sufficient margin needs to be secured between the edge portions E2 of the lower electrodes LE1, LE2 and LE3 and the pixel apertures AP1, AP2 and AP3 in consideration of the positional gaps between the pixel apertures AP1, AP2 and AP3 and the lower electrodes LE1, LE2 and LE3. Because of this configuration, the sizes of the pixel apertures AP1, AP2 and AP3 are restricted. As a result, the improvement of the aperture ratio is difficult.

To the contrary, in the embodiment, the base electrodes BE1, BE2 and BE3 can be arrayed at a narrow pitch as described above. The above margin may be determined based on the edge portions E1 of the base electrodes BE1, BE2 and BE3. Thus, compared to a case where the base electrode BE1, BE2 or BE3 is not provided, the pixel apertures AP1, AP2 and AP3 can be made large, and the aperture ratio can be increased.

It should be noted that the edge portion E2 of the lower electrode LE1, LE2 or LE3 may not be necessarily covered with the rib 5 in a manner different from that of FIG. 5. As another example, at least part of the edge portion E2 of the lower electrode LE1, LE2 or LE3 may not be covered with the rib 5.

Here, this specification explains the result of verification regarding the reflectance of an anode in which a base electrode and a lower electrode are stacked.

Figure 13:
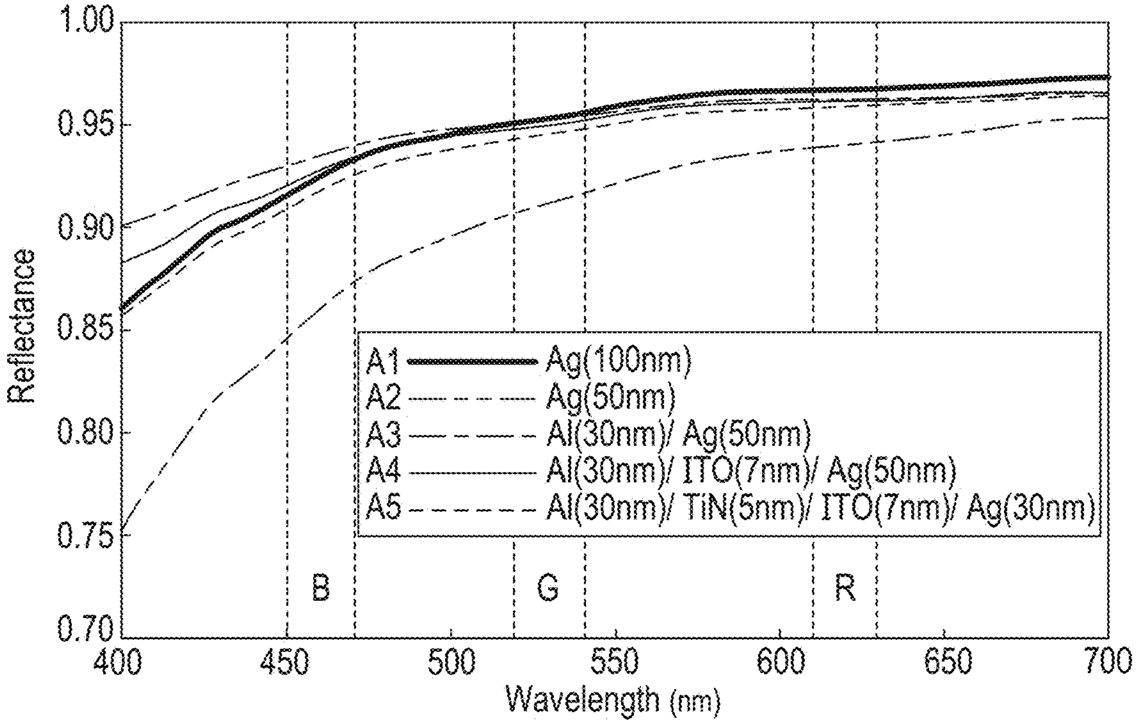
FIG. 13 is a graph showing the result of the simulation of the relationship between the reflectance of an anode and the wavelength.

FIG. 13 is a graph showing the result of the simulation of the relationship between the reflectance of an anode and the wavelength. In this simulation, each of five types of stacked bodies of samples A1 to A5 was provided on the rib 5 formed of silicon oxide, and the reflectance was obtained regarding each of these cases.

Sample A1 consists of a silver layer (Ag) having a thickness of 100 nm. Sample A2 consists of a silver layer having a thickness of 50 nm. Sample A3 is a stacked body in which a silver layer having a thickness of 50 nm is provided on an aluminum layer (Al) having a thickness of 30 nm. Sample A4 is a stacked body in which an ITO layer having a thickness of 7 nm and a silver layer having a thickness of 50 nm are provided in order on an aluminum layer having a thickness of 30 nm. Sample A5 is a stacked body in which a titanium nitride layer (TiN) having a thickness of 5 nm, an ITO layer having a thickness of 7 nm and a silver layer having a thickness of 30 nm are provided in order on an aluminum layer having a thickness of 30 nm. In the figure, R, G and B show red, green and blue wavelength ranges, respectively.

When samples A1 and A2 are compared to each other, it is clear that the reflectance is higher as the silver layer is thicker in all of the red, green and blue wavelength ranges. In samples A3, A4 and A5 each including the aluminum layer, the thicknesses of the silver layers are equal to or less than sample A2. However, in all of the red, green and blue wavelength ranges, the reflectances of samples A3, A4 and A5 are improved to the extent which bears comparison with sample A1. In other words, in a case where each of the base electrodes BE1, BE2 and BE3 includes the first reflective layer RF1 formed of aluminum, and each of the lower electrodes LE1, LE2 and LE3 includes the second reflective layer RF2 formed of silver, a good reflectance can be obtained even if the second reflective layer RF2 is thin.

Figure 14:
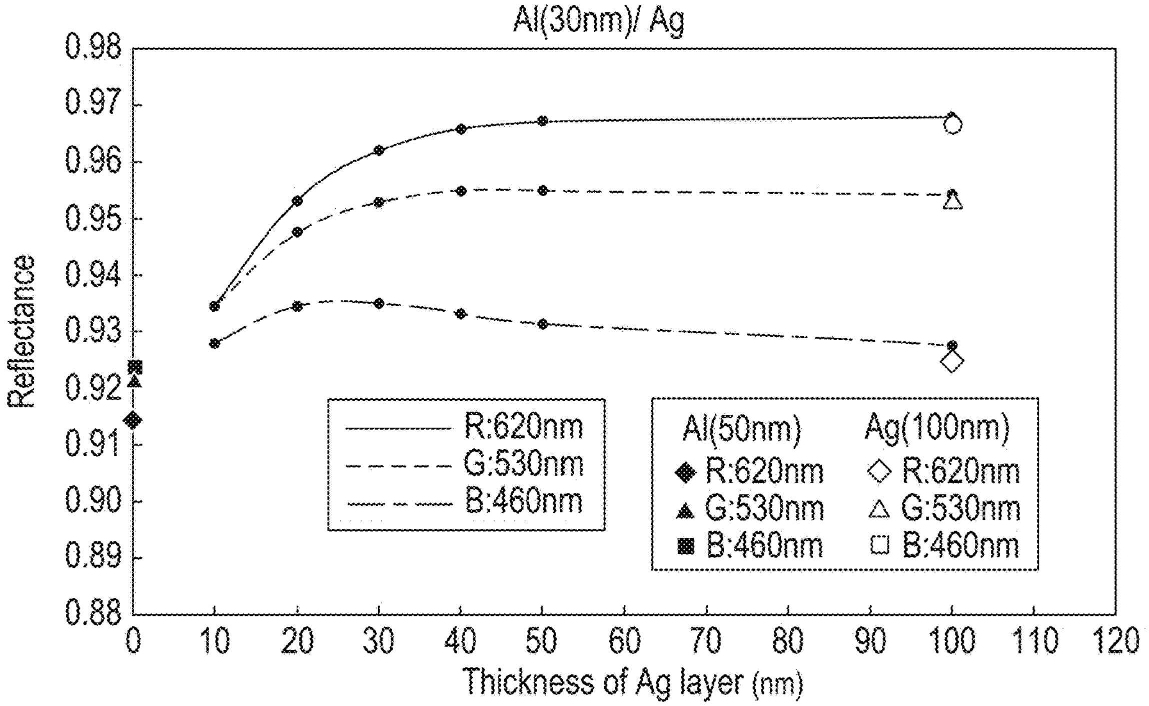
FIG. 14 is a graph showing the result of the simulation of the relationship between the thickness of a silver layer and the reflectance in a stacked body in which the silver layer is provided on an aluminum layer.

FIG. 14 is a graph showing the result of the simulation of the relationship between the thickness of a silver layer and the reflectance in a stacked body in which the silver layer is provided on an aluminum layer having a thickness of 30 nm. This simulation was conducted for each of a red wavelength (R: 620 nm), a green wavelength (G: 530 nm) and a blue wavelength (B: 460 nm). In the graph, the reflectance of a case of only an aluminum layer having a thickness of 50 nm and the reflectance of a case of only a silver layer having a thickness of 100 nm are also plotted.

The reflectance of the red wavelength gradually increases until the thickness of the silver layer reaches approximately 50 nm. However, even if this thickness is further increased, the reflectance does not substantially change. The reflectance of the green wavelength gradually increases until the thickness of the silver layer reaches approximately 40 nm. However, even if this thickness is further increased, the reflectance does not substantially change. The reflectance of the blue wavelength gradually increases until the thickness of the silver layer reaches approximately 20 nm. When this thickness is further increased, the reflectance gradually decreases.

Based on the result of this simulation, the thickness of the second reflective layer RF2 formed of silver should be preferably, for example, in a range of 20 to 50 nm. If the thickness is in this range, a good reflectance can be realized in the wavelength of each color.

Figure 15:
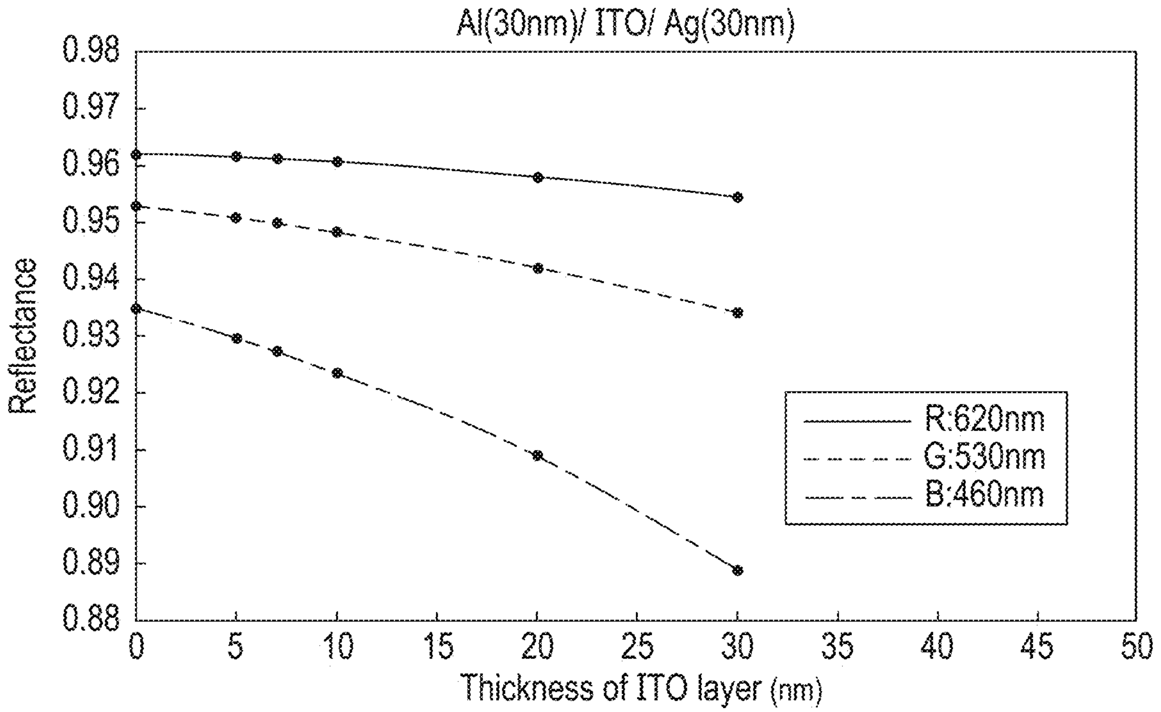
FIG. 15 is a graph showing the result of the simulation of the relationship between the thickness of an ITO layer and the reflectance in a stacked body in which an aluminum layer, the ITO layer and a silver layer are provided in order.

FIG. 15 is a graph showing the result of the simulation of the relationship between the thickness of an ITO layer and the reflectance in a stacked body in which an aluminum layer having a thickness of 30 nm, the ITO layer and a silver layer having a thickness of 30 nm are provided in order from the lower side. This simulation was conducted for each of a red wavelength (R: 620 nm), a green wavelength (G: 530 nm) and a blue wavelength (B: 460 nm).

In all of the red, green and blue wavelengths, the reflectance decreases as the thickness of the ITO layer increases. This result shows that the second transparent oxide layer CL2 formed of ITO should be preferably thin to a maximum extent.

Figure 16:
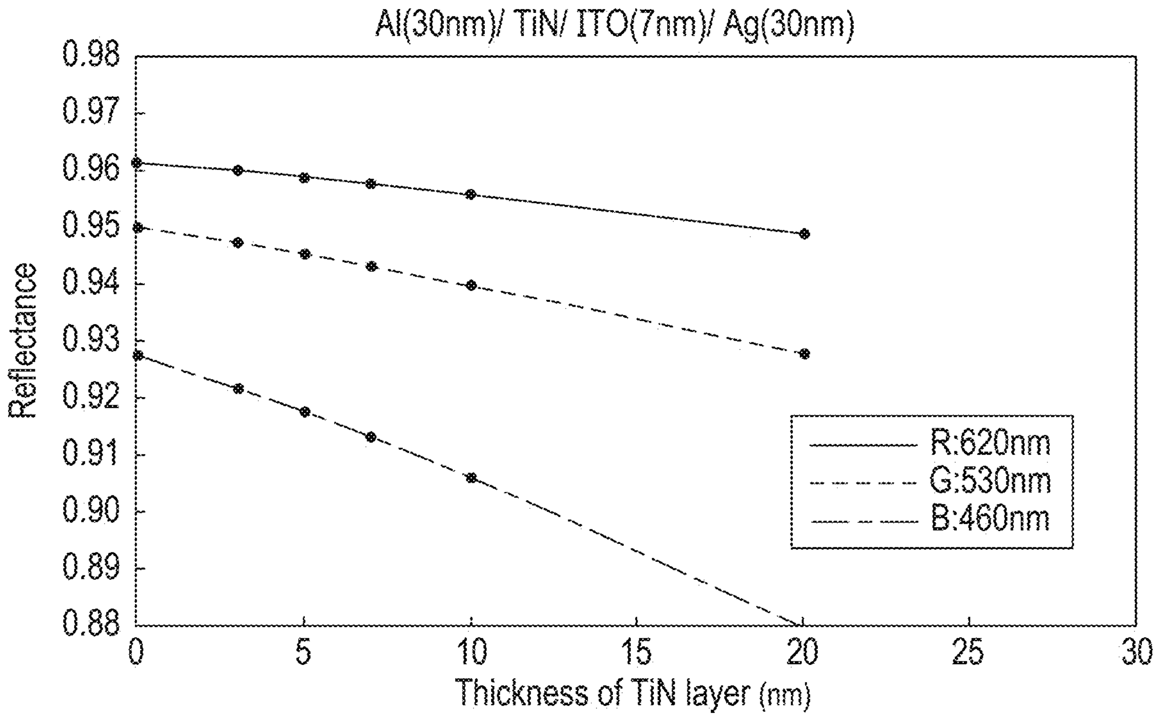
FIG. 16 is a graph showing the result of the simulation of the relationship between the thickness of a titanium nitride layer and the reflectance in a stacked body in which an aluminum layer, the titanium nitride layer, an ITO layer and a silver layer are provided in order.

FIG. 16 is a graph showing the result of the simulation of the relationship between the thickness of a titanium nitride layer and the reflectance in a stacked body in which an aluminum layer having a thickness of 30 nm, the titanium nitride layer, an ITO layer having a thickness of 7 nm and a silver layer having a thickness of 30 nm are provided in order from the lower side. This simulation was conducted for each of a red wavelength (R: 620 nm), a green wavelength (G: 530 nm) and a blue wavelength (B: 460 nm).

In all of the red, green and blue wavelengths, the reflectance decreases as the thickness of the titanium nitride layer increases. This result shows that the first metal layer ML1 formed of titanium nitride should be preferably thin to a maximum extent.

Figure 17:
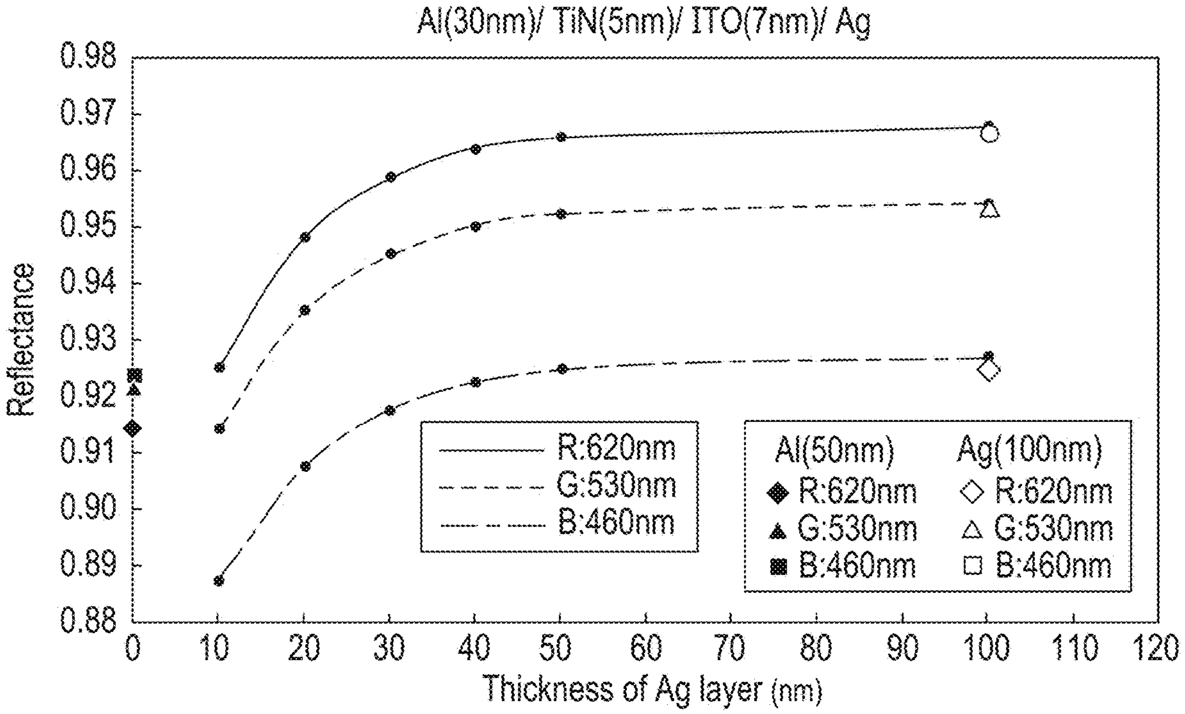
FIG. 17 is a graph showing the result of the simulation of the relationship between the thickness of a silver layer and the reflectance in a stacked body in which an aluminum layer, a titanium nitride layer, an ITO layer and the silver layer are provided in order.

FIG. 17 is a graph showing the result of the simulation of the relationship between the thickness of a silver layer and the reflectance in a stacked body in which an aluminum layer having a thickness of 30 nm, a titanium nitride layer having a thickness of 5 nm, an ITO layer having a thickness of 7 nm and the silver layer are provided in order from the lower side. This simulation was conducted for each of a red wavelength (R: 620 nm), a green wavelength (G: 530 nm) and a blue wavelength (B: 460 nm). In the graph, the reflectance of a case of only an aluminum layer having a thickness of 50 nm and the reflectance of a case of only a silver layer having a thickness of 100 nm are also plotted.

In all of the red, green and blue wavelengths, the reflectance is improved as the thickness of the silver layer increases. However, when the thickness of the silver layer exceeds 50 nm, the change in the reflectance is small. For example, when the thickness of the silver layer is 20 to 50 nm as described above with reference to FIG. 14, the reflectance of each wavelength is in a range which can be considered as an equivalent of a single layer consisting of a silver layer having a thickness of 100 nm.

The results of the simulations shown in FIG. 13 to FIG. 17 described above show that a good reflectance can be realized in each of a configuration in which the first reflective layer RF1 formed of aluminum and the second reflective layer RF2 formed of silver are stacked as shown in the example of FIG. 6, a configuration in which the second transparent oxide layer CL2 formed of ITO is provided between the reflective layers RF1 and RF2 as shown in FIG. 7, and a configuration in which the second transparent oxide layer CL2 formed of ITO and the first metal layer ML1 formed of titanium nitride are provided between the reflective layers RF1 and RF2 as shown in FIG. 8 and FIG. 9.

Second Embodiment

A second embodiment is explained. This embodiment discloses another example of the process of forming base electrodes BE1, BE2 and BE3 and lower electrodes LE1, LE2 and LE3 (process PR2 of FIG. 10). The configuration of a display device DSP and the manufacturing process other than process PR2 are similar to those of the first embodiment.

In a manner similar to that of the example of FIG. 11A to FIG. 11G, this embodiment assumes a case where the base electrodes BE1, BE2 and BE3 and the lower electrodes LE1, LE2 and LE3 comprise the structure shown in FIG. 9. In process PR2 of this embodiment, first, a first layer L1 and a second layer L2 are formed on an organic insulating layer 12 in a manner similar to that of FIG. 11A. Further, a resist R1 is provided on the second layer L2 in a manner similar to that of FIG. 11B. Subsequently, the second layer L2 is patterned into the shapes of the lower electrodes LE1, LE2 and LE3 by first etching similar to that of FIG. 11C to FIG. 11E. In this embodiment, the resist R1 is removed after the first etching and before the implementation of second etching.

Figure 18A:
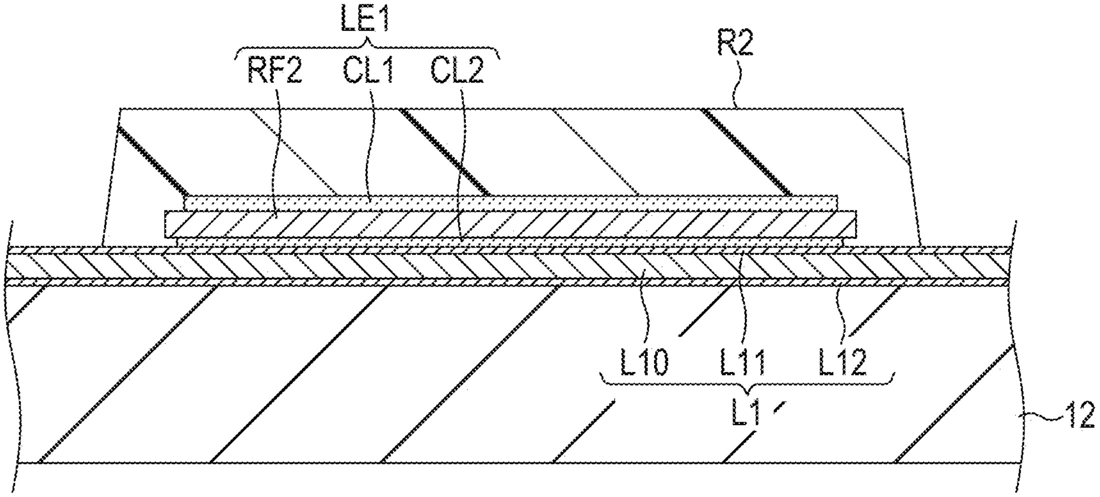
FIG. 18A is a schematic cross-sectional view showing a second etching process according to a second embodiment.
Figure 18B:
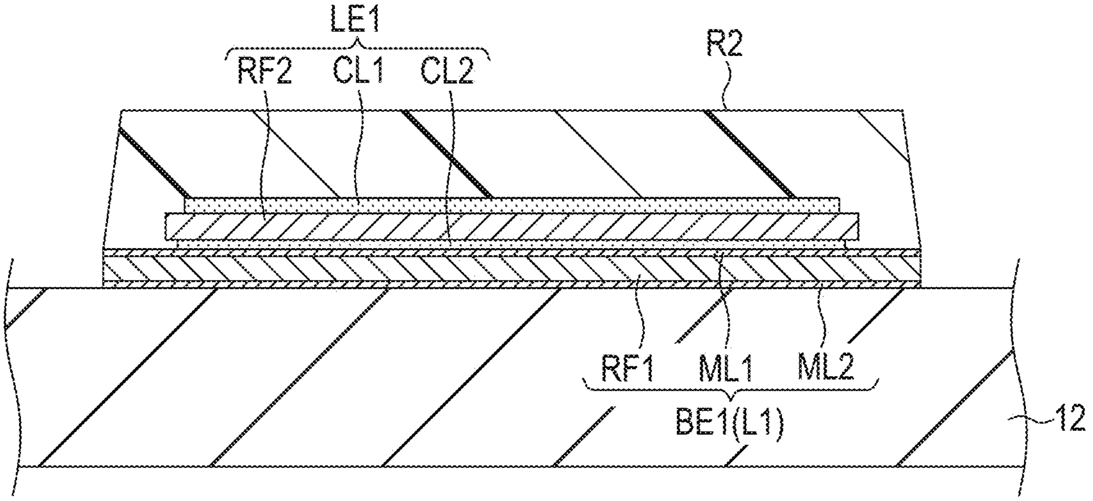
FIG. 18B is a schematic cross-sectional view of a process following FIG. 18A.

FIG. 18A and FIG. 18B are schematic cross-sectional views showing the second etching process according to this embodiment. After the removal of the resist R1 (first resist), a resist R2 (second resist) is provided as shown in FIG. 18A. The resist R2 is patterned into the shapes of the base electrodes BE1, BE2 and BE3.

The resist R2 entirely covers each of the lower electrodes LE1, LE2 and LE3 formed by the first etching. Further, the resist R2 covers the first layer L1 around each of the lower electrodes LE1, LE2 and LE3.

The second etching is performed by using this resist R2 as a mask. Specifically, the portion of the first layer L1 exposed from the resist R2 is removed as shown in FIG. 18B. By this process, the first layer L1 is patterned into the shapes of the base electrodes BE1, BE2 and BE3. After the second etching, the resist R2 is eliminated.

When both the first layer L1 and the second layer L2 are processed using the resist R1 as in the case of the first embodiment, the resist R1 may be eroded in the first etching, and thus, there is a possibility that the base electrode BE1, BE2 or BE3 cannot be formed into the planned outer shape in the second etching. To the contrary, if the resist R1 is removed after the first etching, and the different resist R2 is formed as in the case of this embodiment, the base electrodes BE1, BE2 and BE3 can be accurately formed.

In this embodiment, the different resists are used for the first etching and the second etching. Therefore, a gap may be generated in the relative positional relationships between the lower electrodes LE1, LE2 and LE3 and the base electrodes BE1, BE2 and BE3. In addition, the process for forming and removing the resist R2 is added compared to the first embodiment. To prevent these problems, the manufacturing process of the first embodiment is advantageous.

It should be noted that, when the manufacturing process of the second embodiment is used, the base electrodes BE1, BE2 and BE3 can be intentionally misaligned with the lower electrodes LE1, LE2 and LE3. Such a modified example is explained below.

Figure 19:
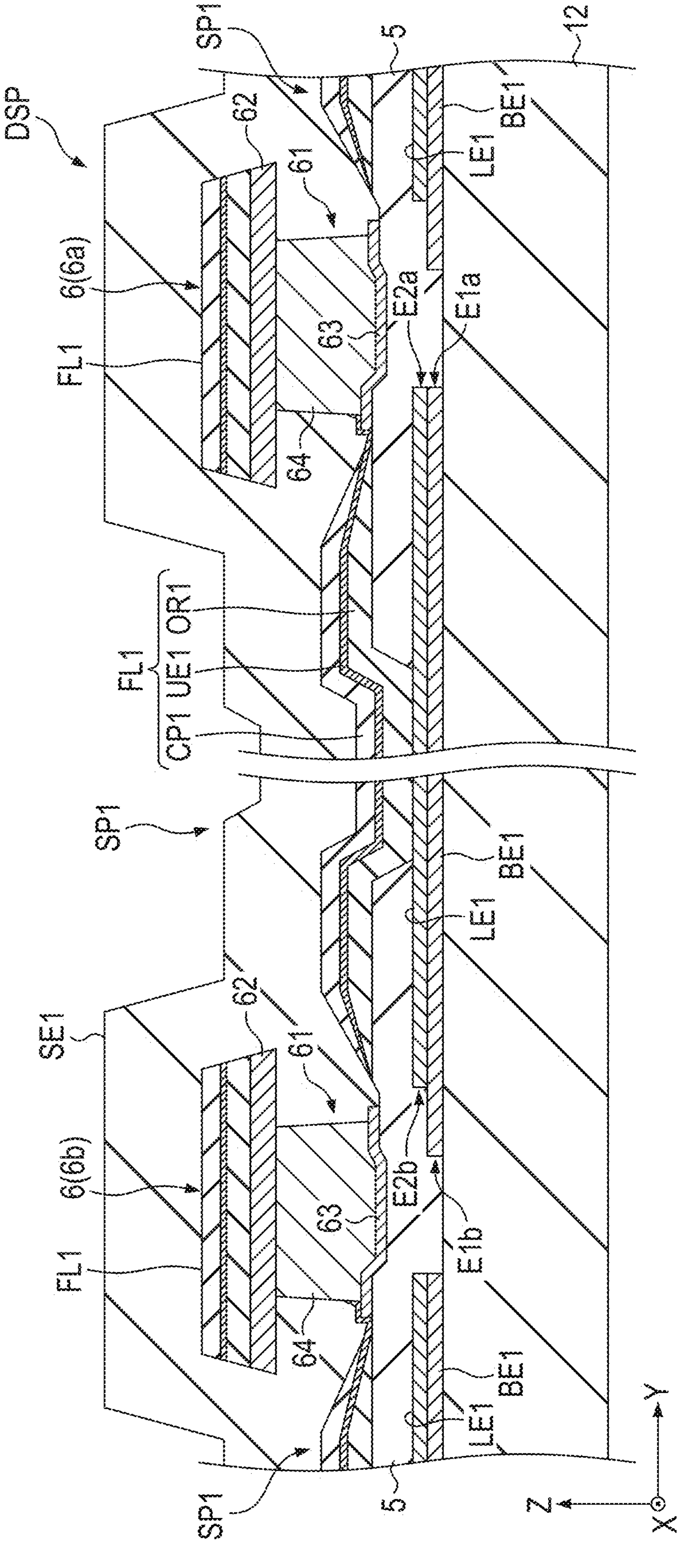
FIG. 19 is a schematic cross-sectional view of the display device according to a modified example.

FIG. 19 is a diagram for explaining the modified example and shows a schematic section of a plurality of subpixels SP1 arranged in a Y-direction in a manner similar to that of FIG. 5. Here, in the figure, the right edge portion of the base electrode BE1 is called a first edge portion E1a, and the left edge portion is called a second edge portion E1b. In addition, in the figure, the right edge portion of the lower electrode LE1 is called a first edge portion E2a, and the left edge portion is called a second edge portion E2b. Further, in the figure, the right partition 6 is called a first partition **6*a*, and the left partition 6 is called a second partition 6*b***.

In the example of FIG. 19, an upper electrode UE1 is in contact with the bottom layer 63 of the first partition **6*a*. However, the upper electrode UE1 is not in contact with the bottom layer 63 of the second partition 6*b*. This upper electrode UE1 can be formed by inclining an evaporation source which emits the material of the upper electrode UE1 with respect to a Z-direction. This configuration enables the upper electrode UE1 to be satisfactorily electrically connected to at least the first partition 6*a***.

It should be noted that the upper electrode UE1 may be slightly in contact with the lower portion 61 of the second partition **6*b*. In this case, the contact area of the upper electrode UE1 and the first partition 6*a* may be greater than that of the upper electrode UE1 and the lower portion 61 of the second partition 6*b***.

In the example of FIG. 19, the first edge portions E1a and E2a are aligned with each other. These first edge portions E1a and E2a are located under the first partition **6*a*. By this configuration, a step to be caused by the first edge portions E1a and E2a is not easily generated on the upper surface of a rib 5 near the first partition 6*a*. In other words, the upper surface of the rib 5 is flat near the first partition 6***a*. This configuration can prevent discontinuity to be caused in the upper electrode UE1 by the above step. Thus, better conduction can be assured between the upper electrode UE1 and the first partition 6*a*.

To the contrary, in the example of FIG. 19, the second edge portions E1b and E2b are misaligned with each other in a manner similar to that of the example of FIG. 5. The second partition 6*b* may not be necessarily electrically connected to the upper electrode UE1. Therefore, even if a step is generated on the upper surface of the rib 5 because of the second edge portion E2b, there is no particular problem in terms of feeding to the upper electrode UE1.

The configuration shown in FIG. 19 can be also applied to subpixels SP2 and SP3. In the configuration shown in FIG. 19, the base electrode BE1 is misaligned with the lower electrode LE1 in the Y-direction. However, the base electrode BE1 may be misaligned with the lower electrode LE1 in an X-direction.

All of the display devices and manufacturing methods thereof that can be implemented by a person of ordinary skill in the art through arbitrary design changes to the display device and manufacturing method thereof described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or by adding or omitting a step or changing the condition of a step, all of the modifications fall within the scope of the present invention as long as they are in keeping with the spirit of the invention.

Further, other effects which may be obtained from the above embodiments and are self-explanatory from the descriptions of the specification or can be arbitrarily conceived by a person of ordinary skill in the art are considered as the effects of the present invention as a matter of course.

What is claimed is:

1. A display device comprising:

a base electrode including a first reflective layer;

a lower electrode including a second reflective layer and provided on the base electrode; and a rib which covers an edge portion of the base electrode and has a pixel aperture overlapping the lower electrode, wherein a width of the base electrode is greater than a width of the lower electrode.

2. The display device of claim 1, wherein the first reflective layer is formed of aluminum or an aluminum alloy.

3. The display device of claim 1, wherein the base electrode further includes at least one of a first metal layer which covers an upper surface of the first reflective layer and a second metal layer which covers a lower surface of the first reflective layer.

4. The display device of claim 3, wherein the first metal layer is formed of titanium nitride, and the second metal layer is formed of titanium.

5. The display device of claim 1, wherein the second reflective layer is formed of silver.

6. The display device of claim 1, wherein the lower electrode further includes at least one of a first transparent oxide layer which covers an upper surface of the second reflective layer and a second transparent oxide layer which covers a lower surface of the second reflective layer.

7. The display device of claim 6, wherein each of the first transparent oxide layer and the second transparent oxide layer is formed of ITO or IZO.

8. The display device of claim 1, further comprising a partition which surrounds the pixel aperture, wherein the partition includes:

a conductive lower portion provided on the rib; and an upper portion having an end portion which protrudes from a side surface of the lower portion.

9. The display device of claim 8, wherein an edge portion of the base electrode overlaps the lower portion as seen in plan view.

10. The display device of claim 8, wherein an edge portion of the lower electrodes does not overlap the lower portion as seen in plan view.

11. The display device of claim 8, further comprising:

an organic layer which covers the lower electrode through the pixel aperture and emits light based on application of voltage; and an upper electrode which covers the organic layer and is in contact with the lower portion.

12. A manufacturing method of a display device, the method including:

forming a first layer including a first reflective layer;

forming a second layer including a second reflective layer on the first layer;

forming a lower electrode by applying first etching to the second layer;

forming a base electrode having a width greater than a width of the lower electrode by applying second etching to the first layer; and forming a rib which covers an edge portion of the base electrode and has a pixel aperture overlapping the lower electrode.

13. The manufacturing method of claim 12, further including providing a first resist on the second layer, wherein in the first etching, the lower electrode is formed under the first resist by removing a portion of the second layer exposed from the first resist.

14. The manufacturing method of claim 13, wherein in the second etching, the base electrode is formed under the first resist by removing a portion of the first layer exposed from the first resist.

15. The manufacturing method of claim 13, further including:

removing the first resist after the first etching; and providing a second resist which covers the lower electrode and the first layer around the lower electrode after removing the first resist, wherein in the second etching, the base electrode is formed under the second resist by removing a portion of the first layer exposed from the second resist.

16. The manufacturing method of claim 12, wherein the first etching includes wet etching for the second reflective layer, and the second etching includes dry etching for the first reflective layer.

17. The manufacturing method of claim 12, wherein the first layer further includes at least one of a first metal layer which covers an upper surface of the first reflective layer and a second metal layer which covers a lower surface of the first reflective layer.

18. The manufacturing method of claim 12, wherein the second layer further includes at least one of a first transparent oxide layer which covers an upper surface of the second reflective layer and a second transparent oxide layer which covers a lower surface of the second reflective layer.

19. The manufacturing method of claim 12, further including forming a partition which surrounds the pixel aperture and includes a conductive lower portion provided on the rib and an upper portion having an end portion protruding from a side surface of the lower portion.

20. The manufacturing method of claim 19, further including:

forming an organic layer which covers the lower electrode through the pixel aperture and emits light based on application of voltage; and forming an upper electrode which covers the organic layer and is in contact with the lower portion.

* * * * *